US012610687B2

(12) United States Patent
Ma et al.

(10) Patent No.: US 12,610,687 B2
(45) Date of Patent: Apr. 21, 2026

(54) LIGHT EMITTING DISPLAY DEVICE INCLUDING A LIGHT TRANSMITTING AREA

(71) Applicant: Samsung Display Co., LTD., Yongin-si (KR)

(72) Inventors: Jin Seock Ma, Hwaseong-si (KR); Sola Lee, Hwaseong-si (KR); Kyung Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 913 days.

(21) Appl. No.: 17/849,371

(22) Filed: Jun. 24, 2022

(65) Prior Publication Data

US 2023/0157069 A1 May 18, 2023

(30) Foreign Application Priority Data

Nov. 11, 2021 (KR) ........................ 10-2021-0154832

(51) Int. Cl.
H01L 27/32 (2006.01)
H01L 51/52 (2006.01)
(Continued)

(52) U.S. Cl.
CPC ......... H10K 59/121 (2023.02); H10K 50/844 (2023.02); H10K 59/131 (2023.02); H10K 59/65 (2023.02)

(58) Field of Classification Search
CPC .. H10K 59/121; H10K 50/856; H10K 59/131; H10K 59/65
See application file for complete search history.

(56) References Cited

U.S. PATENT DOCUMENTS

| | | | |
|---|---|---|---|
| 2019/0173058 A1* | 6/2019 | Choi | ................... H10K 59/131 |
| 2020/0052048 A1 | 2/2020 | Kuo et al. | |

(Continued)

FOREIGN PATENT DOCUMENTS

| | | |
|---|---|---|
| CN | 110278300 A | 9/2019 |
| CN | 111129100 A | 5/2020 |

(Continued)

OTHER PUBLICATIONS

European Search Report issued in related European Application No. 22204980.1, dated Apr. 12, 2023, 11 pages.

*Primary Examiner* — Tracie Y Green
(74) *Attorney, Agent, or Firm* — Womble Bond Dickinson (US) LLP

(57) ABSTRACT

A light emitting display device includes: a first display area that includes a first pixel circuit part and a first light emitting element connected to the first pixel circuit part; a (2-1)-th display area that includes a (2-1)-th pixel circuit part, a (2-1)-th light emitting element connected to the (2-1)-th pixel circuit part, and a (2-2)-th pixel circuit part; and a (2-2)-th display area that includes a (2-2)-th light emitting element connected to the (2-2)-th pixel circuit part and a light transmitting area, wherein the first pixel circuit part of the first display area is below the first light emitting element, the (2-1)-th pixel circuit part of the (2-1)-th display area is below the (2-1)-th light emitting element, and at least one organic film in the first pixel circuit part and the (2-1)-th pixel circuit part is not included in the light transmitting area.

13 Claims, 15 Drawing Sheets

(51) Int. Cl.

| | |
|---|---|
| *H10K 50/844* | (2023.01) |
| *H10K 59/121* | (2023.01) |
| *H10K 59/131* | (2023.01) |
| *H10K 59/65* | (2023.01) |

(56) References Cited

U.S. PATENT DOCUMENTS

| | | | |
|---|---|---|---|
| 2021/0066648 A1 | 3/2021 | Chung et al. | |
| 2021/0191552 A1 | 6/2021 | Bok et al. | |
| 2021/0193691 A1* | 6/2021 | Lee ..................... | H10D 86/60 |
| 2021/0193758 A1 | 6/2021 | Choi et al. | |
| 2021/0327967 A1 | 10/2021 | Zhang et al. | |
| 2021/0335955 A1 | 10/2021 | Son et al. | |
| 2021/0366933 A1 | 11/2021 | Zhang | |
| 2022/0028949 A1 | 1/2022 | Ko et al. | |
| 2023/0209891 A1* | 6/2023 | Ma ..................... | H10K 59/131 |
| | | | 257/40 |

FOREIGN PATENT DOCUMENTS

| | | | |
|---|---|---|---|
| CN | 111129102 A | 5/2020 | |
| CN | 111725287 A | 9/2020 | |
| EP | 3823032 A1 | 5/2021 | |
| EP | 3944352 A1 | 1/2022 | |
| KR | 10-2020-0089743 A | 7/2020 | |
| KR | 10-2020-0131400 A | 11/2020 | |
| KR | 10-2021-0082316 A | 7/2021 | |

* cited by examiner

LIGHT EMITTING DISPLAY DEVICE INCLUDING A LIGHT TRANSMITTING AREA

CROSS-REFERENCE TO RELATED APPLICATION

This application claims priority to and the benefit of Korean Patent Application No. 10-2021-0154832, filed in the Korean Intellectual Property Office on Nov. 11, 2021, the entire content of which is hereby incorporated by reference.

BACKGROUND

1. Field

The present disclosure relates to a light emitting display device, and more particularly, to a light emitting display device in which an optical device such as a camera may be positioned on a rear surface of a display area.

2. Description of the Related Art

A display device is a device for displaying an image, and includes a liquid crystal display (LCD), an organic light emitting diode (OLED) display, and/or the like. The display device is utilized in one or more suitable electronic devices such as a mobile phone, a navigation device, a digital camera, an electronic book, a portable game machine, and one or more suitable terminals.

For example, in a small electronic device such as a mobile phone, an optical device such as a camera and an optical sensor is formed in a bezel area around a display area, but as a size of the display area is increased while a size of a peripheral area of the display area is gradually decreased, a technology in which a camera or an optical sensor may be positioned on a rear surface of the display area is being developed.

The above information disclosed in this Background section is only for enhancement of understanding of the background of the described technology, and therefore it may contain information that does not form the prior art that is already known in this country to a person of ordinary skill in the art.

SUMMARY

One or more aspects of the present disclosure are directed towards a light emitting display device in which performance of an optical device may be improved because light transmittance of a light transmitting area is high even when the optical device such as a camera or an optical sensor is positioned on a rear surface of the light transmitting area of a display area. One or more aspects of the present disclosure are directed towards a light emitting display device in which a display area is not reduced because an image may be displayed even on a front surface of an optical device even when the optical device such as a camera or an optical sensor is positioned on a rear surface of a light transmitting area of the display area.

According to an embodiment, a light emitting display device includes: a first display area that includes a first pixel circuit part and a first light emitting element connected to the first pixel circuit part; a (2-1)-th display area that includes a (2-1)-th pixel circuit part, a (2-1)-th light emitting element connected to the (2-1)-th pixel circuit part, and a (2-2)-th pixel circuit part; and a (2-2)-th display area that includes a (2-2)-th light emitting element connected to the (2-2)-th pixel circuit part and a light transmitting area, wherein the first pixel circuit part of the first display area is below the first light emitting element, the (2-1)-th pixel circuit part of the (2-1)-th display area is below the (2-1)-th light emitting element, and at least one organic film in the first pixel circuit part and the (2-1)-th pixel circuit part is not included in the light transmitting area.

The light emitting display device may further include a transparent connecting wire that connects the (2-2)-th pixel circuit part and a pixel electrode of the (2-2)-th light emitting element, and is made of a transparent conductive material.

The transparent connecting wire may be across the (2-1)-th display area and the (2-2)-th display area.

The light emitting display device may further include a connecting portion connecting the (2-1)-th pixel circuit part and a (2-1)-th pixel electrode of the (2-1)-th light emitting element, wherein the connecting portion may be in the (2-1)-th display area.

The light emitting display device may further include: a first additional inorganic insulating film between the transparent connecting wire and a substrate; and a second additional inorganic insulating film between the transparent connecting wire and the pixel electrode of the (2-2)-th light emitting element.

The first additional inorganic insulating film and the second additional inorganic insulating film may include (e.g., be) at least one inorganic insulating material selected from a silicon nitride (SiNx), a silicon oxide (SiOx), and a silicon oxynitride (SiOxNy).

The light emitting display device may further include an encapsulation layer across the first display area, the (2-1)-th display area, and the (2-2)-th display area, wherein the encapsulation layer may include a first encapsulation inorganic layer, an encapsulation organic layer, and a second encapsulation inorganic layer that are sequentially stacked.

A functional layer may be between a pixel electrode and an opposite electrode in each of the first light emitting element, the (2-1)-th light emitting element, and the (2-2)-th light emitting element; the functional layer may be across the first display area, the (2-1)-th display area, and the (2-2)-th display area; and in the light transmitting area, the second additional inorganic insulating film, the functional layer, and the first encapsulation inorganic layer may be sequentially stacked.

The light emitting display device may further include: a copy connecting wire between the substrate and the first additional inorganic insulating film; a second copy connecting wire on the first additional inorganic insulating film; and a copy pixel electrode on the second additional inorganic insulating film, wherein the (2-2)-th pixel circuit part and the copy pixel electrode may be electrically connected by the copy connecting wire and the second copy connecting wire, and the copy connecting wire and the second copy connecting wire may be made of a transparent conductive material.

The light emitting display device may further include: a buffer layer between a substrate and the first additional inorganic insulating film; a copy connecting wire between the substrate and the buffer layer; a second copy connecting wire on the buffer layer; and a copy pixel electrode on the second additional inorganic insulating film, wherein the (2-2)-th pixel circuit part and the copy pixel electrode may be electrically connected by the copy connecting wire and the second copy connecting wire, and the copy connecting wire and the second copy connecting wire may be made of a transparent conductive material.

The first additional inorganic insulating film and the second additional inorganic insulating film may extend into at least one selected from the first display area and the (2-1)-th display area.

The light emitting display device may further include a third additional inorganic insulating film on the second additional inorganic insulating film.

The first light emitting element of the first display area may at least partially overlap the first pixel circuit part connected to the first light emitting element, in a plan view; and the (2-1)-th light emitting element of the (2-1)-th display area may not overlap the (2-1)-th pixel circuit part connected to the (2-1)-th light emitting element, in the plan view.

According to another embodiment, a light emitting display device, including: a first display area that includes a first pixel circuit part and a first light emitting element connected to the first pixel circuit part; a (2-1)-th display area that includes a (2-1)-th pixel circuit part, a (2-1)-th light emitting element connected to the (2-1)-th pixel circuit part, and a (2-2)-th pixel circuit part; and a (2-2)-th display area that includes a (2-2)-th light emitting element connected to the (2-2)-th pixel circuit part and a light transmitting area, wherein the light transmitting area includes: a substrate; a first additional inorganic insulating film on the substrate; a second additional inorganic insulating film on the first additional inorganic insulating film; and an encapsulation layer on the second additional inorganic insulating film and covering the first display area, the (2-1)-th display area, and the (2-2)-th display area, and the encapsulation layer includes a first encapsulation inorganic layer, an encapsulation organic layer, and a second encapsulation inorganic layer, and the first encapsulation inorganic layer, the encapsulation organic layer, and the second encapsulation inorganic layer are sequentially stacked on the second additional inorganic insulating film.

The light transmitting area may not include (e.g., may exclude) an insulating layer including (e.g., being) an organic material except for the encapsulation organic layer.

The light transmitting area may further include a transparent connecting wire that connects the (2-2)-th pixel circuit part and a pixel electrode of the (2-2)-th light emitting element, and is made of a transparent conductive material, and the transparent connecting wire is between the first additional inorganic insulating film and the second additional inorganic insulating film.

The light transmitting area may further include a buffer layer between the substrate and the first additional inorganic insulating film, and the buffer layer extends into the first display area and the (2-1)-th display area.

The first display area and the (2-1)-th display area may include: a buffer layer on the substrate; a semiconductor layer on the buffer layer; a first gate insulating film on the semiconductor layer; a first gate conductive layer on the first gate insulating film; a second gate insulating film on the first gate conductive layer; a second gate conductive layer on the second gate insulating film; a first interlayer insulating film on the second gate conductive layer; a first data conductive layer on the first interlayer insulating film; a first organic film on the first data conductive layer; a second data conductive layer on the first organic film; and a second organic film on the second data conductive layer, and the first additional inorganic insulating film may extend into the first display area and the (2-1)-th display area to be between the first organic film and the second organic film, and the second additional inorganic insulating film may extend into the first display area and the (2-1)-th display area to be on the second organic film.

The light transmitting area may further include a third additional inorganic insulating film on the second additional inorganic insulating film, the first display area and the (2-1)-th display area may further include a third organic film on the second organic film, and the third additional inorganic insulating film extends into the first display area and the (2-1)-th display area to be on the third organic film.

The light emitting display device may further include: a copy connecting wire connected to the (2-2)-th pixel circuit part; and a copy pixel electrode connected to the copy connecting wire and in the (2-2)-th display area, wherein the copy connecting wire may be made of a transparent conductive material.

According to one or more aspects of the present disclosure, although an optical device such as a camera or an optical sensor is on a rear surface of a display area, only a light emitting element may be on a front surface of the optical device to display an image even on the front surface of the optical device. According to one or more aspects of the present disclosure, performance of an optical device on a rear surface of a display panel may be improved by forming an inorganic insulating film, instead of an organic film in another display area, in a light transmitting area on a front surface of the optical device to improve light transmittance.

BRIEF DESCRIPTION OF THE DRAWINGS

FIG. 2 illustrates an enlarged schematic view of a first display area and a second display area in a light emitting display device according to an embodiment.

DETAILED DESCRIPTION

Figure 1:
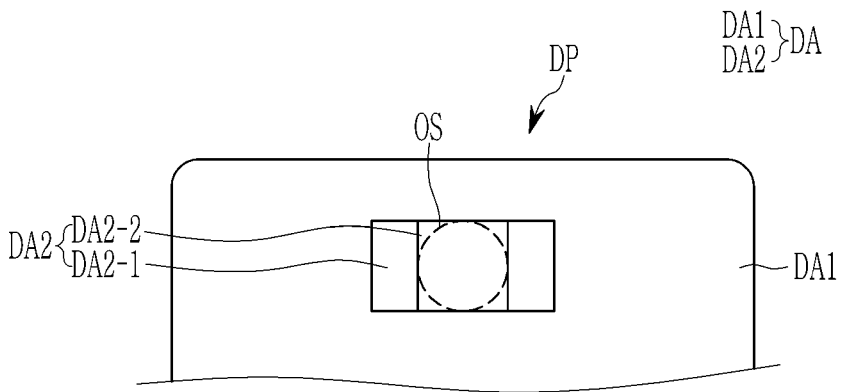
FIG. 1 illustrates an enlarged top plan view of a partial area of a light emitting display device according to an embodiment.

The present disclosure will be described more fully hereinafter with reference to the accompanying drawings, in which embodiments of the present disclosure are shown. As those of ordinary skill in the art would realize, the described embodiments may be modified in one or more suitable different ways, all without departing from the spirit or scope of the present disclosure. As used herein, the use of the term "may," when describing embodiments of the present disclosure, refers to "one or more embodiments of the present disclosure."

In order to clearly describe the present disclosure, parts or portions that are irrelevant to the description may be omitted, and identical or similar constituent elements throughout the specification are denoted by the same reference numerals.

Further, in the drawings, the illustrated size and thickness of each element may be exaggerated for ease of description, and the present disclosure is not necessarily limited to those illustrated in the drawings. In the drawings, the thicknesses of layers, films, panels, regions, areas, etc., may be exaggerated for clarity. In the drawings, for ease of description, the thicknesses of some layers and areas may be exaggerated.

It will be understood that when an element such as a layer, film, region, area, substrate, plate, or constituent element is referred to as being "on" another element, it can be directly on the other element or one or more intervening elements may also be present. In contrast, when an element is referred to as being "directly on" another element, there are no intervening elements present. Further, in the specification, the word "on" or "above" refers to one element being positioned on or below another element, and does not necessarily refer to the one element being positioned on an upper side of the other element based on a gravitational direction. As used herein, the term "and/or" includes any and all combinations of one or more of the associated listed items.

In some embodiments, unless explicitly described to the contrary, the word "comprise" and "include," and variations such as "comprises," "comprising," "includes," and "including," will be understood to imply the inclusion of stated elements but not the exclusion of any other elements.

Further, throughout the specification, the phrase "in a plan view" or "on a plane" refers to viewing a target portion from the top, and the phrase "in a cross-sectional view" or "on a cross-section" refers to viewing a cross-section formed by vertically cutting a target portion from the side.

In some embodiments, throughout the specification, "connected" does not refer to only when two or more elements are directly connected, but may also refer to when two or more elements are indirectly connected through one or more other elements, and when they are physically connected and/or electrically connected, and further, it may be referred to by different names depending on a position or function, and may also be referred to as a case in which respective parts that are substantially integrated are linked to each other.

In some embodiments, throughout the specification, when it is said that an element such as a wire, layer, film, region, area, substrate, plate, or constituent element "is extended (or extends) in a first direction or second direction", this does not refer to only a straight shape extending straight in the corresponding direction, but may also refer to a structure that substantially extends in the first direction or the second direction, is partially bent, has a zigzag structure, or extends while having a curved structure.

As used herein, the term "substantially" and similar terms are used as terms of approximation and not as terms of degree, and are intended to account for the inherent deviations in measured or calculated values that would be recognized by those of ordinary skill in the art. Also, the terms "about," "approximately," and similar terms, when used herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In some embodiments, both (e.g., simultaneously) an electronic device (for example, a mobile phone, a TV, a monitor, a laptop computer, etc.) including a display device, or a display panel described in the specification, and an electronic device including a display device and a display panel manufactured by a manufacturing method described in the specification are not excluded from the scope of the present specification.

A display area of a light emitting display device according to an embodiment will be described with reference to FIG. 1, and a position of an optical device such as a camera or an optical sensor will be described.

FIG. 1 illustrates an enlarged top plan view of a partial area of a light emitting display device according to an embodiment.

FIG. 1 illustrates a portion of a display panel DP of a display device according to an embodiment, wherein the display panel is for a mobile phone.

A display area DA is positioned in a front surface of the display panel DP, and the display area DA is largely divided into a first display area DA1 and a second display area DA2.

A plurality of light emitting elements, and a plurality of pixel circuit parts that generate and transmit a light emitting current (e.g., a current to be utilized to emit light) to each of the plurality of light emitting elements, are formed in the first display area DA1. Here, one light emitting element and one pixel circuit part are referred to as a pixel PX. One pixel circuit part and one light emitting element are formed at a one-to-one ratio in the first display area DA1. The first display area DA1 is hereinafter also referred to as a "normal display area".

Although a structure of the display panel DP below a cutting line is not shown in FIG. 1, the first display area DA1 may be positioned below the cutting line.

An optical element OS such as a camera and/or an optical sensor is positioned on a rear surface of the display panel DP, and in FIG. 1, because the optical element OS is positioned on the rear surface, it is shown as a dotted line. In some embodiments, the optical element OS is spaced apart from the front surface of the display panel DP toward the rear surface of the display panel DP along a thickness direction of the display panel DP.

The second display area DA2 is positioned on a front surface of and around (e.g., surrounding) the optical element OS. The second display area DA2 may overlap at least part (e.g., all) of the optical element OS in the plan view. The second display area DA2 is divided into a (2-1)-th display area DA2-1 and a (2-2)-th display area DA2-2.

The (2-2)-th display area DA2-2 is a display area positioned on the front surface of the optical element OS, and a plurality of light emitting elements are formed therein to display an image, but the pixel circuit part that generates and transmits a light emitting current to the light emitting element is not formed in the (2-2)-th display area DA2-2, but is positioned in the (2-1)-th display area DA2-1 adjacent thereto. The pixel circuit part positioned in the (2-1)-th display area DA2-1 and the light emitting element positioned in the (2-2)-th display area DA2-2 may be electrically connected to each other through a transparent connecting line. In the (2-2)-th display area DA2-2, an area other than the area in which the plurality of light emitting elements are positioned is formed as a transparent light transmitting area, and a camera or an optical sensor, which is the optical element OS, captures or senses an object positioned in front of the display panel DP through the light transmitting area. In FIG. 1, the (2-2)-th display area DA2-2 is shown as a quadrangular shape. However, the present disclosure is not limited thereto. For example, the (2-2)-th display area DA2-2 may have a shape corresponding to a planar shape of the optical element OS, such as a circular shape, in some embodiments. Hereinafter, the (2-2)-th display area DA2-2 is also referred to as a "transparent display area".

The (2-1)-th display area DA2-1 may be positioned at one side or both (e.g., simultaneously) sides of the (2-2)-th display area DA2-2, and is positioned between the first display area DA1 and the (2-2)-th display area DA2-2. In the (2-1)-th display area DA2-1, one pixel circuit and one light emitting element are formed at a one-to-one ratio, and additionally, a pixel circuit for transmitting a light emitting current to the plurality of light emitting elements formed in the (2-2)-th display area DA2-2 is further included. Hereinafter, the (2-2)-th display area DA2-1 is also referred to as an 'intermediate display area'.

FIG. 1 illustrates the embodiment in which the (2-1)-th display areas DA2-1 are positioned at both (e.g., simultaneously) left and right sides of the (2-2)-th display area DA2-2, and a left-right width (a width in a left-right direction, as shown in FIG. 1) of one (2-1)-th display area DA2-1 may be half of a left-right width of the (2-2)-th display area DA2-2. In some embodiments, the first display area DA1 is positioned in an area in which the (2-1)-th display area DA2-1, as an area adjacent to the (2-2)-th display area DA2-2, is not positioned. In some embodiments, the first display area DA1 is positioned adjacent to the (2-1)-th display area DA2-1 and/or to the (2-2)-th display area DA2-2, for example, around (e.g., surrounding) the (2-1)-th display area DA2-1 and/or to the (2-2)-th display area DA2-2. A direction in which the (2-1)-th display area DA2-1 is positioned based on the (2-2)-th display area DA2-2 may coincide with an extension direction (a first direction) of a scan line, which will be described later. In some embodiments, the transparent connecting wire formed in the second display area DA2 may extend from the (2-1)-th display area DA2-1 to the (2-2)-th display area DA2-2.

A peripheral area may be further positioned outside the display area DA. Although FIG. 1 illustrates the display panel for the mobile phone, the present embodiment may be applied as long as it is a display panel in which the optical element OS may be positioned on the rear surface of the display panel or spaced apart from the front surface of the display panel towards the rear surface of the display panel along the thickness direction of the display panel.

Hereinafter, the structure of the display area DA will be described in more detail with reference to FIG. 2.

Figure 2:
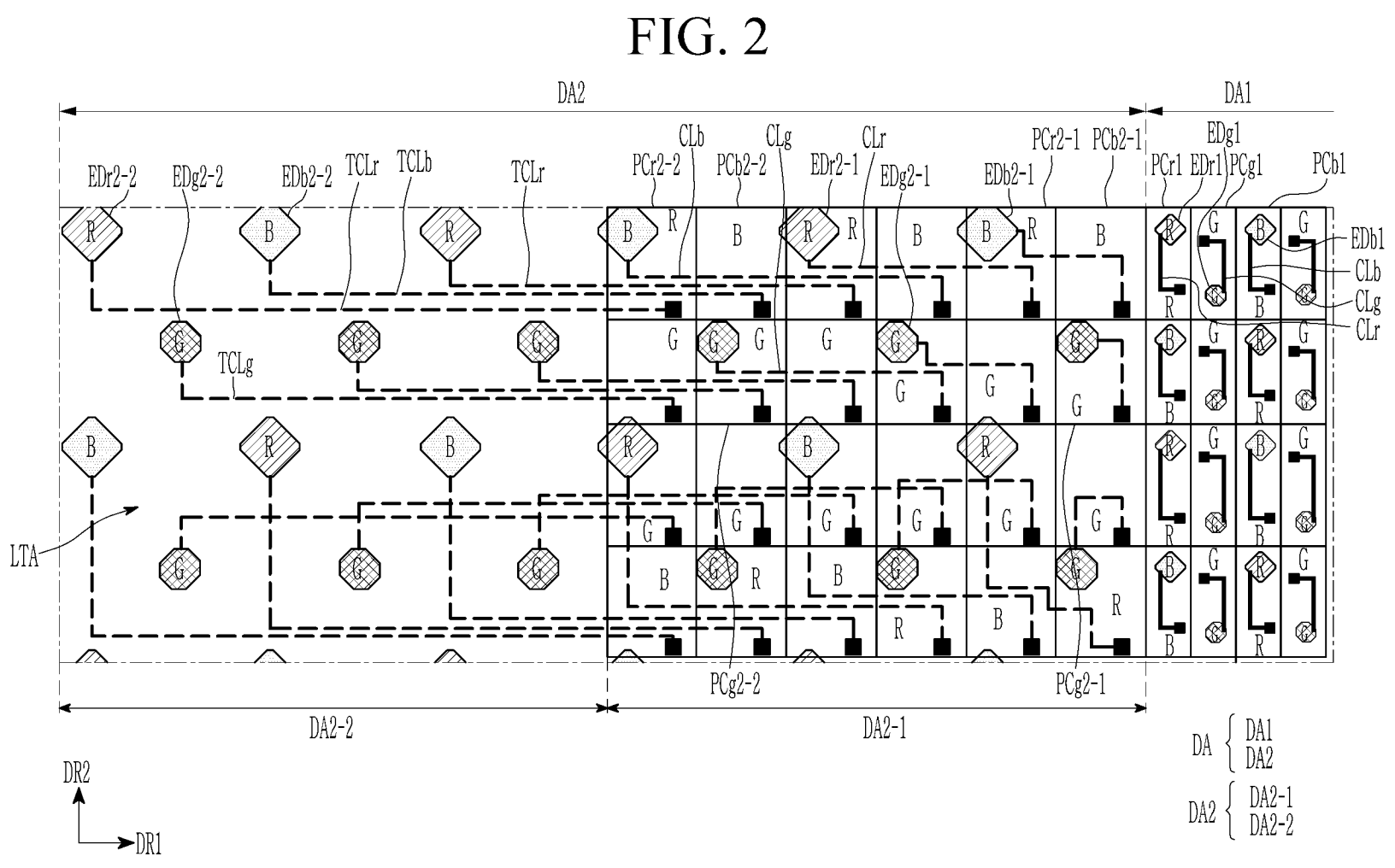

FIG. 2 illustrates an enlarged schematic view of a first display area and a second display area in a light emitting display device according to an embodiment.

FIG. 2 illustrates a disposition and connection structure of the pixel circuit part and the light emitting element configuring the pixel PX in the first display area DA1 (normal display area), the (2-1)-th display area DA2-1 (intermediate display area), and the (2-2)-th display area DA2-2 (transparent display area) according to the embodiment.

First, a plurality of light emitting elements EDr1, EDg1, and EDb1 (hereinafter also referred to as light emitting elements for the normal display area) and a plurality of pixel circuit parts PCr1, PCg1, and PCb1 (hereinafter, also referred to as pixel circuit parts for the normal display area) that are formed in substantially the same number are formed in the first display area DA1 (normal display area). In FIG. 2, the pixel circuit parts PCr1, PCg1, and PCb1 of the first display area DA1 are illustrated as a rectangular shape, and the plurality of light emitting elements EDr1, EDg1, and EDb1 are illustrated as a rhombic or octagonal shape. It is illustrated that the plurality of light emitting elements EDr1, EDg1, and EDb1 are positioned on the front surface (or upper portion) compared with each of the connected pixel circuit parts PCr1, PCg1, and PCb1 to overlap the pixel circuit parts PCr1, PCg1, and PCb1 in a plan view. Connecting portions CLr, CLg, and CLb extending from the plurality of light emitting elements EDr1, EDg1, and EDb1 are illustrated, so that which pixel circuit parts PCr1, PCg1, and PCb1 are connected to the plurality of light emitting elements EDr1, EDg1, and EDb1 are more clearly illustrated. Referring to FIG. 2, the light emitting elements EDr1, EDg1, and EDb1 of the first display area DA1 at least partially overlap the pixel circuit parts PCr1, PCg1, and PCb1 connected to the light emitting elements EDr1, EDg1, and EDb1 in a plan view. In some embodiments, the light emitting elements EDr1, EDg1, and EDb1 may be first light emitting elements, and the pixel circuit parts PCr1, PCg1, and PCb1 may be first pixel circuit parts. Each of the plurality of light emitting elements EDr1, EDg1, and EDb1 includes an anode (hereinafter also referred to as a pixel electrode), a light emitting layer, and a cathode (refer to FIG. 10; hereinafter also referred to as an opposite electrode). A planar shape of the light emitting element is not limited to the rhombic or octagonal shape illustrated in FIG. 2, and may have one or more suitable shapes such as a circular shape and a hexagonal shape. Here, the connecting portions CLr, CLg, and CLb may be made of a transparent conductive material, or an opaque conductive material such as a metal.

In the embodiment of FIG. 2, four pixels are utilized as a unit pixel and are repeatedly arranged. The four pixels configuring one unit pixel includes (e.g., consists of) one red pixel, one blue pixel, and two green pixels. In some examples, the pixels may be arranged in a PENTILE® (Trademark of Samsung Display Co., Ltd.) arrangement. However, in some embodiments, at least one red pixel, at least one green pixel, and at least one blue pixel may be included. For example, three pixels including one red pixel, one blue pixel, and one green pixel may form a unit pixel, and the unit pixels may be repeatedly arranged in row and/or column directions. In some embodiments, in the embodiment of FIG. 2, positions of the red light emitting element EDr1 and the blue light emitting element EDb1 are changed for each row. However, the number and arrangement of the pixels or light emitting elements may be variously and suitably changed.

In the (2-1)-th display area DA2-1 (intermediate display area) of the second display area DA2, a plurality of pixel circuit parts PCr2-1, PCr2-2, PCg2-1, PCg2-2, PCb2-1, and PCb2-2 and a plurality of light emitting elements EDr2-1, EDg2-1, and EDb2-1 are positioned. The plurality of pixel circuit parts PCr2-1, PCr2-2, PCg2-1, PCg2-2, PCb2-1, and PCb2-2 of the (2-1)-th display area DA2-1 are divided into the pixel circuit parts PCr2-1, PCg2-1, and PCb2-1 (hereinafter also referred to as the pixel circuit parts for the intermediate display area) for the (2-1)-th display area and the pixel circuit parts PCr2-2, PCg2-2, and PCb2-2 (hereinafter also referred to as the pixel circuit parts for the transparent display area) for the (2-2)-th display area. The pixel circuit parts PCr2-1, PCg2-1, and PCb2-1 for the (2-1)-th display area are pixel circuit parts that transmit a light emitting current to the plurality of light emitting elements EDr2-1, EDg2-1, and EDb2-1 (hereinafter also referred to as the light emitting elements for the intermediate display area) for the (2-1)-th display area positioned in the (2-1)-th display area DA2-1 (intermediate display area). The pixel circuit parts PCr2-1, PCg2-1, and PCb2-1 for the (2-1)-th display area and the light emitting elements EDr2-1, EDg2-1, and EDb2-1 for the (2-1)-th display area may correspond to each other one-to-one. Referring to FIG. 2, in some embodiments, at least some of the light emitting elements EDr2-1, EDg2-1, and EDb2-1 for the (2-1)-th display area of the (2-1)-th display area DA2-1 do not overlap the pixel circuit parts PCr2-1, PCg2-1, and PCb2-1 for the (2-1)-th display area connected to the light emitting elements EDr2-1, EDg2-1, and EDb2-1 for the (2-1)-th display area.

In some embodiments, the pixel circuit parts PCr2-2, PCg2-2, and PCb2-2 for the (2-2)-th display area are positioned in the (2-1)-th display area DA2-1 (intermediate display area), however, they generate a light emitting current to be transmitted to the light emitting elements EDr2-2, EDg2-2, and EDb2-2 for the (2-2)-th display area positioned in the (2-2)-th display area DA2-2 (transparent display area).

The pixel circuit parts PCr2-1, PCg2-1, and PCb2-1 for the (2-1)-th display area and the pixel circuit parts PCr2-2, PCg2-2, and PCb2-2 for the (2-2)-th display area have the same planar structure and circuit structure, except for the structure connected to the light emitting element.

In the embodiment of FIG. 2, three pixel circuit parts PCr2-1, PCg2-1, and PCb2-1 for the (2-1)-th display area are formed (e.g., continuously formed) in a first direction DR1, and three pixel circuit parts PCr2-2, PCg2-2, and PCb2-2 for the (2-2)-th display area are positioned adjacent to the (2-2)-th display area DA2-2. In this case, only the red and blue pixel circuit parts are positioned in one row, and only the green pixel circuit parts are positioned in another row. In some embodiments, the pixel circuit parts PCr2-1, PCg2-1, and PCb2-1 for the (2-1)-th display area and the pixel circuit parts PCr2-2, PCg2-2, and PCb2-2 for the (2-2)-th display area may be alternately disposed one by one. In some embodiments, it may be the same as the arrangement of pixels in the first display area DA1. The arrangement and number of pixel circuit parts may vary according to embodiments.

No pixel circuit part is formed in the (2-2)-th display area DA2-2 (transparent display area), and light emitting elements EDr2-2, EDg2-2, and EDb2-2 for the (2-2)-th display area (hereinafter also referred to as light emitting elements for the transparent display area), transparent connecting wires TCLr, TCLg, and TCLb connected thereto, and a light transmitting area LTA are formed therein.

In FIG. 2, the light emitting elements EDr2-2, EDg2-2, and EDb2-2 for the (2-2)-th display area and the transparent connecting wires TCLr, TCLg, and TCLb are illustrated in the (2-2)-th display area DA2-2 (transparent display area), and a portion in which nothing is illustrated corresponds to the light transmitting area LTA. Here, a portion of the light transmitting area LTA corresponding to the pixel circuit part and the light emitting element may be formed as an inorganic insulating film without including an organic film. In some embodiments, the light transmitting area LTA may include an organic film in an encapsulation layer (see Encap in FIG. 10) positioned thereon, and may include only the inorganic insulating layer excluding the encapsulation layer.

One light emitting element EDr2-2, EDg2-2, or EDb2-2 for the (2-2)-th display area is connected to one pixel circuit part PCr2-2, PCg2-2, or PCb2-2 for the (2-2)-th display area positioned in the (2-1)-th display area DA2-1 through one transparent connecting wire TCLr, TCLg, or TCLb. The transparent connecting wires TCLr, TCLg, and TCLb are connected to the pixel circuit parts (PCr2-2, PCg2-2, and PCb2-2) for the (2-2)-th display area positioned in the (2-1)-th display area DA2-1 (intermediate display area) to receive the light emitting current and transmit it to the light emitting elements EDr2-2, EDg2-2, and EDb2-2 for the (2-2)-th display area. In some embodiments, the transparent connecting wires TCLr, TCLg, and TCLb are made of a transparent conductive material, so that the transparent area of the (2-2)-th display area DA2-2 (transparent display area) may be increased and the light transmittance of the (2-2)-th display area DA2-2 may be increased. Due to this structure, performance of an operation captured or sensed by the optical element OS on the rear surface of the (2-2)-th display area DA2-2 (transparent display area) may be improved. In some embodiments, the transparent connecting wires TCLr, TCLg, and TCLb may be made of an opaque metal in the (2-1)-th display area DA2-1, and may be made of a transparent conductive material only in the (2-2)-th display area DA2-2 (transparent display area).

In the embodiment of FIG. 2, the (2-1)-th display area DA2-1 (intermediate display area) is positioned between the first display area DA1 and the (2-2)-th display area DA2-2 (transparent display area) in the first direction DR1. For example, the first display area DA1 (normal display area), the (2-1)-th display area DA2-1 (intermediate display area), and the (2-2)-th display area DA2-2 (transparent display area) may be sequentially positioned or arranged with each other along the first direction DR1.

In some embodiments, a wire (a scan line, an initialization control line, etc.) required in the (2-1)-th display area DA2-1 (intermediate display area) or the first display area DA1 (normal display area) may pass (e.g., pass through) the (2-2)-th display area DA2-2 (transparent display area). The passing wire may include (e.g., be) a transparent conductive material, and may be formed of a non-transparent metal in some embodiments. In some embodiments, the passing wire may be positioned along an outer periphery of the (2-2)-th display area DA2-2 (transparent display area).

In FIG. 2, the pixel circuit parts PCr2-1, PCr2-2, PCg2-1, PCg2-2, PCb2-1, and PCb2-2 positioned in the second display area DA2 are shown to be twice as large (e.g., twice as long) in the first direction DR1 than the pixel circuit parts PCr1, PCg1, and PCb1 positioned in the first display area DA1, so that an area thereof is doubled. As such, when the area occupied by the pixel circuit part is large, a size (width or length of a channel) of a transistor such as a driving transistor or a size (capacitance size) of a capacitor positioned inside the pixel circuit part is also formed large. As a result, an amount of an output current outputted from the pixel circuit part is also large. Referring to FIG. 2, the light emitting elements EDr2-1, EDg2-1, EDb2-1, EDr2-2, EDg2-2, and EDb2-2 positioned in the second display area DA2 are also shown to be larger than the light emitting elements EDr1, EDg1, and EDb1 positioned in the first display area DA1. When the light emitting element is large, an output current for driving it is also required to be large. Therefore, in order to drive the larger light emitting elements EDr2-1, EDg2-1, EDb2-1, EDr2-2, EDg2-2, and EDb2-2 positioned in the second display area DA2, the pixel circuit parts PCr2-1, PCr2-2, PCg2-1, PCg2-2, PCb2-1, and PCb2-2 are also formed to be large to generate a large output current. In the embodiment shown in FIG. 2, a plurality of light emitting elements may be connected to each one pixel circuit part of the second display area DA2, and in this case, a size of the light emitting element may be the same as that of the light emitting element of the first display area DA1. As described above, unlike the first display area DA1, a plurality of light emitting elements may be connected to the pixel circuit part of the second display area DA2, so that the pixel circuit part may be formed large to transmit an output current to the plurality of light emitting elements. An area of the pixel circuit part of the second display area DA2 may be formed to be 4 times larger than that of the pixel circuit part of the first display area DA1, and a difference in the area may be suitably varied according to embodiments.

According to the embodiment of FIG. 2, based on a unit area, a sum of the number of the pixel circuit parts PCr2-1, PCg2-1, and PCb2-1 for the (2-1)-th display area that are positioned in the (2-1)-th display area DA2-1 and the number of the pixel circuit parts PCr2-2, PCg2-2, and PCb2-2 for the (2-2)-th display area may be half of the number of the pixel circuit parts PCr1, PCg1, and PCb1 positioned in the first display area DA1 (normal display area). For example, a density of the number of the pixel circuit parts PCr2-1, PCr2-2, PCg2-1, PCg2-2, PCb2-1, and PCb2-2 per unit area in the (2-1)-th display area DA2-1 may be half of a density of the number of the pixel circuit parts PCr1, PCg1, and PCb1 per unit area in the first display area DA1. Because the number of the pixel circuit parts (PCr2-1, PCg2-1, and PCb2-1) for the (2-1)-th display area positioned in the (2-1)-th display area DA2-1 (intermediate display area) and the number of the pixel circuit parts PCr2-2, PCg2-2, and PCb2-2 for the (2-2)-th display area may be the same, the number of the light emitting elements positioned in the (2-1)-th display area DA2-1 (intermediate display area) or the (2-2)-th display area DA2-2 (transparent display area) may be ¼ of the number of the light emitting elements positioned in the first display area DA1 (normal display area). For example, a density of the number of light emitting elements per unit area in the (2-1)-th display area DA2-1 may be ¼ of a density of the number of light emitting elements per unit area in the first display area DA1, and/or a density of the number of light emitting elements per unit area in the (2-2)-th display area DA2-2 may be ¼ of the density of the number of light emitting elements per unit area in the first display area DA1. Accordingly, a pixel per inch (PPI) value of the pixels positioned in the second display area DA2 is smaller than a PPI value of the pixels formed in the first display area DA1. As such, when the number of the light emitting elements in the second display area DA2 is smaller than the number of the light emitting elements in the first display area DA1 based on the unit area, the area of the light emitting elements in the second display area DA2 may be larger than the area of the light emitting elements in the first display area DA1.

In some embodiments, based on the unit area, a sum of the number of the pixel circuit parts PCr2-1, PCg2-1, and PCb2-1 for the (2-1)-th display area that are positioned in the (2-1)-th display area DA2-1 and the number of the pixel circuit parts PCr2-2, PCg2-2, and PCb2-2 for the (2-2)-th display area may be the same as the number of the pixel circuit parts PCr1, PCg1, and PCb1 positioned in the first display area DA1 (normal display area). In this case, based on the unit area, the number of the light emitting elements positioned in the (2-1)-th display area DA2-1 (intermediate display area) or the (2-2)-th display area DA2-2 (transparent display area) may be ½ of the number of the light emitting elements positioned in the first display area DA1 (normal display area). In some embodiments, the number of the pixels (or light emitting elements) positioned in the (2-1)-th display area DA2-1 (intermediate display area) or the (2-2)-th display area DA2-2 (transparent display area) may vary, and a ratio of the number of the light emitting elements between respective display areas may also vary. In some embodiments, a plurality of light emitting devices connected to one pixel circuit part are formed in the second display area DA2, so that a pixel per inch (PPI) value of the pixel of the first display area DA1 and a pixel per inch (PPI) value of the pixel formed in the second display area DA2 may be the same. In the case of having the same pixel per inch (PPI) as described above, a size (e.g., planar area) of the light emitting element of the second display area DA2 and a size of the light emitting element of the first display area DA1 may be identical or substantially identical to each other.

In the above, the structures of the first display area DA1 and the second display area DA2 has been described as a whole and according to some embodiments based on FIG. 2.

Hereinafter, a more detailed connection structure of the second display area DA2 according to another embodiment will be described with reference to FIG. 3 and FIG. 4.

Figure 3:
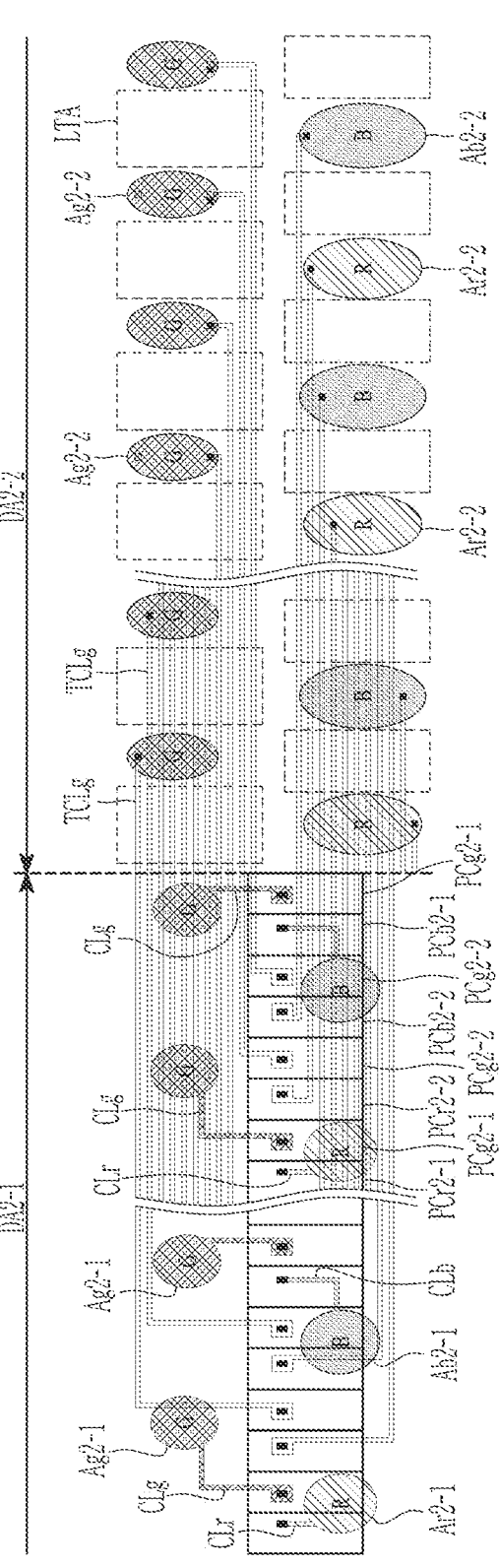
FIG. 3 and FIG. 4 illustrate enlarged views of a second display area in a light emitting display device according to another embodiment.
Figure 4:
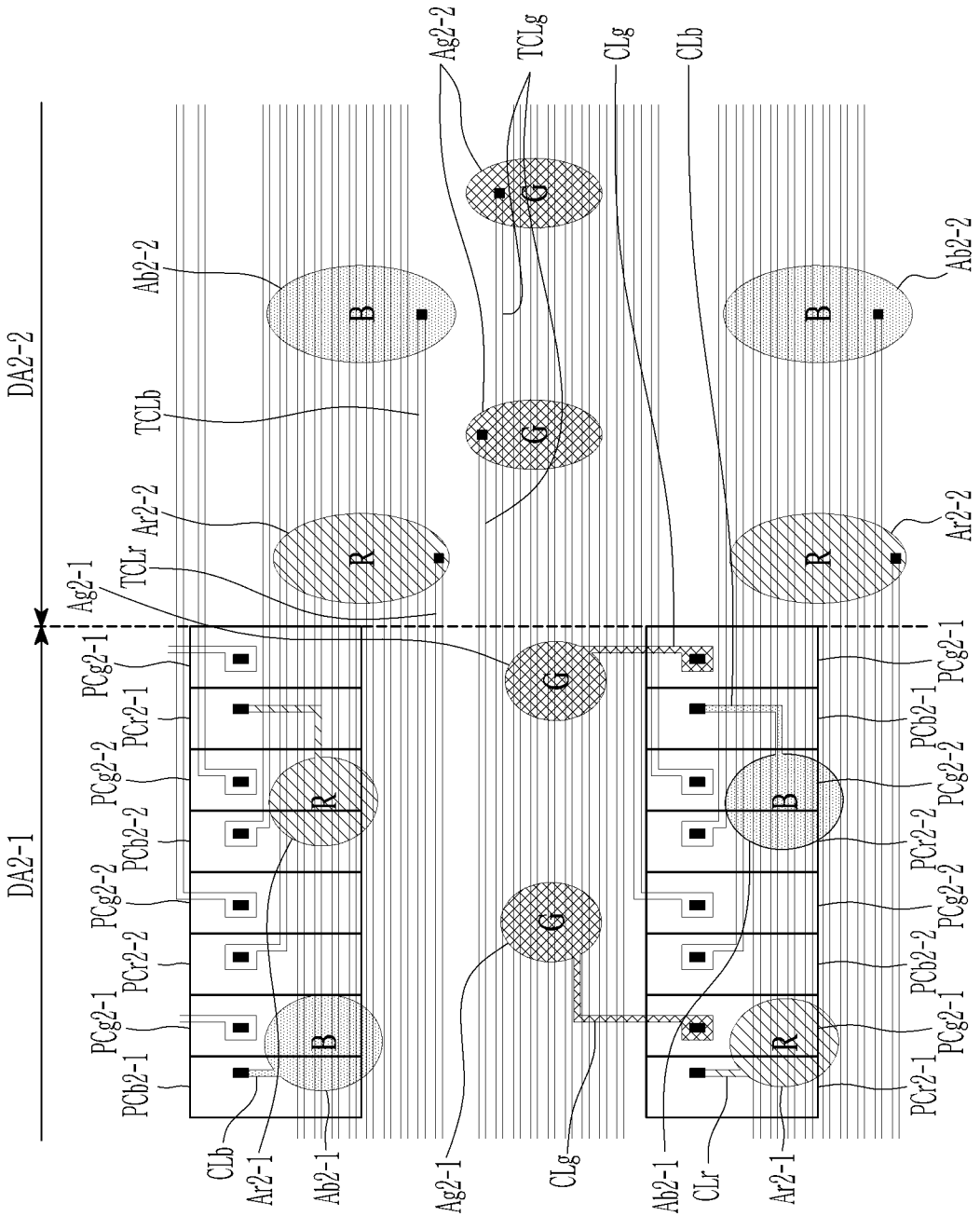

FIG. 3 and FIG. 4 illustrate enlarged views of a second display area in a light emitting display device according to another embodiment.

Unlike in FIG. 2, in FIG. 3 and FIG. 4, a portion in which the (2-2)-th display area DA2-2 (transparent display area) is positioned at the right of the (2-1)-th display area DA2-1 (intermediate display area) is enlarged and illustrated. For reference, a structure symmetrical to the left and right of the structure illustrated in FIG. 3 and FIG. 4 is further formed at an opposite side.

Unlike FIG. 2, FIG. 3 and FIG. 4 illustrate anodes Ar2-1, Ag2-1, Ab2-1, Ar2-2, Ag2-2, and Ab2-2 configuring the light emitting element. The anodes Ar2-1, Ag2-1, Ab2-1, Ar2-2, Ag2-2, and Ab2-2 may be divided into anodes Ar2-1, Ag2-1, and Ab2-1 for the (2-1)-th display area (hereafter pixel electrodes for the (2-1)-th display area) and anodes Ar2-2, Ag2-2, and Ab2-2 for the (2-2)-th display area (hereafter pixel electrodes for the (2-2)-th display area).

In FIG. 3, a total of two unit pixel circuit parts are illustrated, when 8 pixel circuit parts including 4 pixel circuit parts for the (2-1)-th display area and 4 pixel circuit parts for the (2-2)-th display area in the (2-1)-th display area DA2-1 are referred to as a unit pixel circuit part. Here, 4 pixel circuit parts PCr2-1, PCg2-1, and PCb2-1 for the (2-1)-th display area and 4 pixel circuit parts PCr2-2, PCg2-2, and PCb2-2 for the (2-2)-th display area respectively include one pixel circuit part PCr2-1 or PCr2-2 for red, one pixel circuit part PCb2-1 or PCb2-2 for blue, and two pixel circuit parts PCg2-1 and PCg2-2 for green. A broken line is drawn between two unit pixel circuit parts illustrated in FIG. 3, so that the unit pixel circuit parts are not adjacent to each other, and the two unit pixel circuit parts illustrated in FIG. 3 may be unit pixel circuit parts positioned at both outermost sides of the (2-1)-th display area DA2-1.

In the (2-1)-th display area DA2-1 of FIG. 3, the anodes Ar2-1, Ag2-1, and Ab2-1 for the (2-1)-th display area respectively connected to the pixel circuit parts PCr2-1, PCg2-1, and PCb2-1 for the (2-1)-th display area are positioned, and the connecting portion CLr, CLg, and CLb respectively connecting the pixel circuit parts PCr2-1, PCg2-1, and PCb2-1 for the (2-1)-th display area and the anodes Ar2-1, Ag2-1, and Ab2-1 for the (2-1)-th display area are formed.

Additionally, in the (2-1)-th display area DA2-1 of FIG. 3, some of the transparent connecting wires TCLr, TCLg, and TCLb extending to the anodes Ar2-2, Ag2-2, and Ab2-2 for the (2-2)-th display area positioned in the (2-2)-th display area DA2-2 from the pixel circuit parts PCr2-2, PCg2-2, and PCb2-2 for the (2-2)-th display area are positioned.

Here, the connecting portions CLr, CLg, and CLb may be made of a transparent conductive material or an opaque conductive material such as a metal, and the transparent connecting wires TCLr, TCLg, and TCLb may be made of a transparent conductive material. In some embodiments, the transparent connecting wires TCLr, TCLg, and TCLb may be made of an opaque metal in the (2-1)-th display area DA2-1, and may be made of a transparent conductive material only in the (2-2)-th display area DA2-2 (transparent display area). For examples, each of at least some of the transparent connecting wires TCLr, TCLg, and TCLb may have a portion in the (2-1)-th display area DA2-1 that includes (e.g., is) an opaque metal and another portion in the (2-2)-th display area DA2-2 that includes (e.g., is) a transparent conductive material.

The anodes Ar2-1, Ag2-1, and Ab2-1 for the (2-1)-th display area illustrated in the (2-1)-th display area DA2-1 of FIG. 3 are shown as two unit anodes, when one red anode Ar2-1, one blue anode Ab2-1, and two green anodes Ag2-1 are referred to as a unit anode. Hereinafter, the unit anode is also referred to as a unit light emitting element.

In the embodiment of FIG. 3, the red and blue anodes Ar2-1 and Ab2-1 for the (2-1)-th display area are formed at a position overlapping the pixel circuit parts PCr2-1, PCg2-1, and PCb2-1 for the (2-1)-th display area in a plan view, and the green anode Ag2-1 for the (2-1)-th display area is formed at a positioned not overlapping the pixel circuit parts PCr2-1, PCg2-1, and PCb2-1 for the (2-1)-th display area in a plan view as a position overlapping the transparent connecting wires TCLr, TCLg, and TCLb in a plan view. However, the light emitting element may be variously and suitably positioned.

In some embodiments, in the (2-2)-th display area DA2-2 of FIG. 3, the anodes Ar2-2, Ag2-2, and Ab2-2 for the (2-2)-th display area, the transparent connecting wires TCLr, TCLg, and TCLb connected to the anodes Ar2-2, Ag2-2, and Ab2-2 for the (2-2)-th display area, and the light transmitting area LTA are positioned.

The anodes Ar2-2, Ag2-2, and Ab2-2 for the (2-2)-th display area illustrated in the (2-2)-th display area DA2-2 of FIG. 3 are shown as three unit anodes, and when one red anode Ar2-2, one blue anode Ab2-2, and two green anodes Ag2-2 are referred to as a unit anode. A broken line is illustrated between the three unit anodes illustrated in the (2-2)-th display area DA2-2 of FIG. 3, so that in the (2-2)-th display area DA2-2, a unit anode positioned at a leftmost side and two unit anodes positioned at a most central portion are illustrated.

In the (2-2)-th display area DA2-2, the transparent connecting wires TCLr, TCLg, and TCLb extending from the (2-1)-th display area DA2-1 are positioned. In the embodiment of FIG. 3, at least some of the anodes Ar2-2, Ag2-2, and Ab2-2 for the (2-2)-th display area positioned in the (2-2)-th display area DA2-2 may overlap the transparent connecting wires TCLr, TCLg, and TCLb in a plan view.

In FIG. 3, although the light transmitting area LTA is illustrated in a dotted quadrangular shape, in the actual (2-2)-th display area DA2-2, all portions through which light may be transmitted may be included, and all of the (2-2)-th display area DA2-2 may be the light transmitting area LTA except for an area in which the anodes Ar2-2, Ag2-2, and Ab2-2 for the (2-2)-th display area are positioned.

The anodes Ar2-2, Ag2-2, and Ab2-2 for the (2-2)-th display area may have the same arrangement as the anodes Ar2-1, Ag2-1, and Ab2-1 for the (2-1)-th display area. For example, only green light emitting elements may be positioned in one row, and red and blue light emitting elements may be alternately positioned or arranged with each other in another row.

Referring to FIG. 3, the anodes Ar2-2, Ag2-2, and Ab2-2 for the (2-2)-th display area are formed to be larger than the anodes Ar2-1, Ag2-1, and Ab2-1 for the (2-1)-th display area. However, in some embodiments, two light emitting elements may have the same size as each other. For example, the anodes Ar2-1 and Ar2-2 may be the same in size, the anodes Ag2-1 and Ag2-2 may be the same in size, and/or the anodes Ab2-1 and Ab2-2 may be the same in size.

A connection structure between the pixel circuit part and the light emitting element will be described in more detail with reference to FIG. 4, which is an enlarged view of the structure of FIG. 3 as described above.

FIG. 4 mainly illustrates one unit pixel circuit part and eight anodes of the light emitting elements connected thereto, and additionally illustrates some of the unit pixel circuit part and the light emitting element positioned at an upper portion.

The unit pixel circuit part and the anodes illustrated in FIG. 4 are positioned at both (e.g., simultaneously) sides of a boundary between the (2-1)-th display area DA2-1 and the (2-2)-th display area DA2-2.

Referring to FIG. 4, disposition of one unit pixel circuit part in the (2-1)-th display area DA2-1 is as follows.

In the unit pixel circuit part, the red pixel circuit part PCr2-1 for the (2-1)-th display area is positioned at a leftmost side thereof, the green pixel circuit part PCg2-1 for the (2-1)-th display area is positioned at the right side thereof, and at the right side thereof, the blue pixel circuit part PCb2-2 for the (2-2)-th display area, the green pixel circuit part PCg2-2 for the (2-2)-th display area, the red pixel circuit part PCr2-2 for the (2-2)-th display area, and the green pixel circuit part PCg2-2 for the (2-2)-th display area sequentially positioned. The blue pixel circuit part PCb2-1 for the (2-1)-th display area is positioned at the right side thereof, and the green pixel circuit part PCg2-1 for the (2-1)-th display area is positioned at the right side thereof.

The pixel circuit parts PCr2-1, PCg2-1, and PCb2-1 for the (2-1)-th display area of the unit pixel circuit parts are connected to the anodes Ar2-1, Ag2-1, and Ab2-1 for the (2-1)-th display area positioned in the (2-1)-th display area DA2-1 through the connecting portions CLr, CLg, and CLb. The red and blue anodes Ar2-1 and Ab2-1 for the (2-1)-th display area of the anodes Ar2-1, Ag2-1, and Ab2-1 for the (2-1)-th display area may overlap the pixel circuit part in a plan view. In some embodiments, the green anode Ag2-1 for the (2-1)-th display area does not overlap the pixel circuit part in a plan view, but may overlap the transparent connecting wires TCLr, TCLg, and TCLb in a plan view.

The pixel circuit parts PCr2-2, PCg2-2, and PCb2-2 for the (2-2)-th display area among the unit pixel circuit part are connected to the anodes Ar2-2, Ag2-2, and Ab2-2 for the (2-2)-th display area positioned in the (2-2)-th display area DA2-2 through the transparent connecting wires TCLr, TCLg, and TCLb. Although the transparent connecting wires TCLr, TCLg, and TCLb are made of a transparent conductive material and are formed in the (2-2)-th display area DA2-2, they allow the light transmitting area LTA to not be reduced.

In the embodiment of FIG. 3 and FIG. 4, among the unit pixel circuit part, the connecting portion CLg and the transparent connecting wire TCLg connected to the green unit pixel circuit part, while upwardly extending, are connected to the anodes Ag2-1 and Ag2-2 of the light emitting element, and the connecting portions CLr and CLb and the transparent connecting wires TCLr and TCLb connected to the red and blue unit pixel circuit parts, while downwardly extending, are connected to the anodes Ar2-1, Ar2-2, Ab2-1, and Ab2-2. For example, among the transparent connecting wires TCLr, TCLg, and TCLb, the green transparent connecting wire TCLg may upwardly extend and then be bent to extend to and into the (2-2)-th display area DA2-2, and the red and blue transparent connecting wires TCLr and TCLb may downwardly extend and then be bent to extend to and into the (2-2)-th display area DA2-2. However, in some embodiments, a different connection structure may be provided from the structure described above.

Although it is illustrated that the transparent connecting wires TCLr, TCLg, and TCLb and the connecting portions CLr, CLg, and CLb are formed on different layers and overlap each other in a plan view, they are electrically insulated from each other.

The anodes Ar2-2, Ag2-2, and Ab2-2 for the (2-2)-th display area illustrated in FIG. 4 may be electrically connected to the pixel circuit parts PCr2-2, PCg2-2, and PCb2-2 for the (2-2)-th display area of the unit pixel circuit part positioned at a leftmost side illustrated in FIG. 3.

The pixel circuit parts PCr2-2, PCg2-2, and PCb2-2 for the (2-2)-th display area illustrated in FIG. 4 may be electrically connected to the anodes Ar2-2, Ag2-2, and Ab2-2 for the (2-2)-th display area positioned at a rightmost side illustrated in FIG. 3.

The arrangement of the pixel circuit parts and the light emitting elements or anodes of FIG. 2 to FIG. 4 may be variously and suitably changed.

In some embodiments, in FIG. 2 to FIG. 4, the embodiment in which one pixel circuit part and one light emitting element or anode are connected to each other one-to-one has been described.

Hereinafter, an embodiment in which a plurality of light emitting elements or anodes are connected to one pixel circuit part will be described with reference to FIG. 5.

Figure 5:
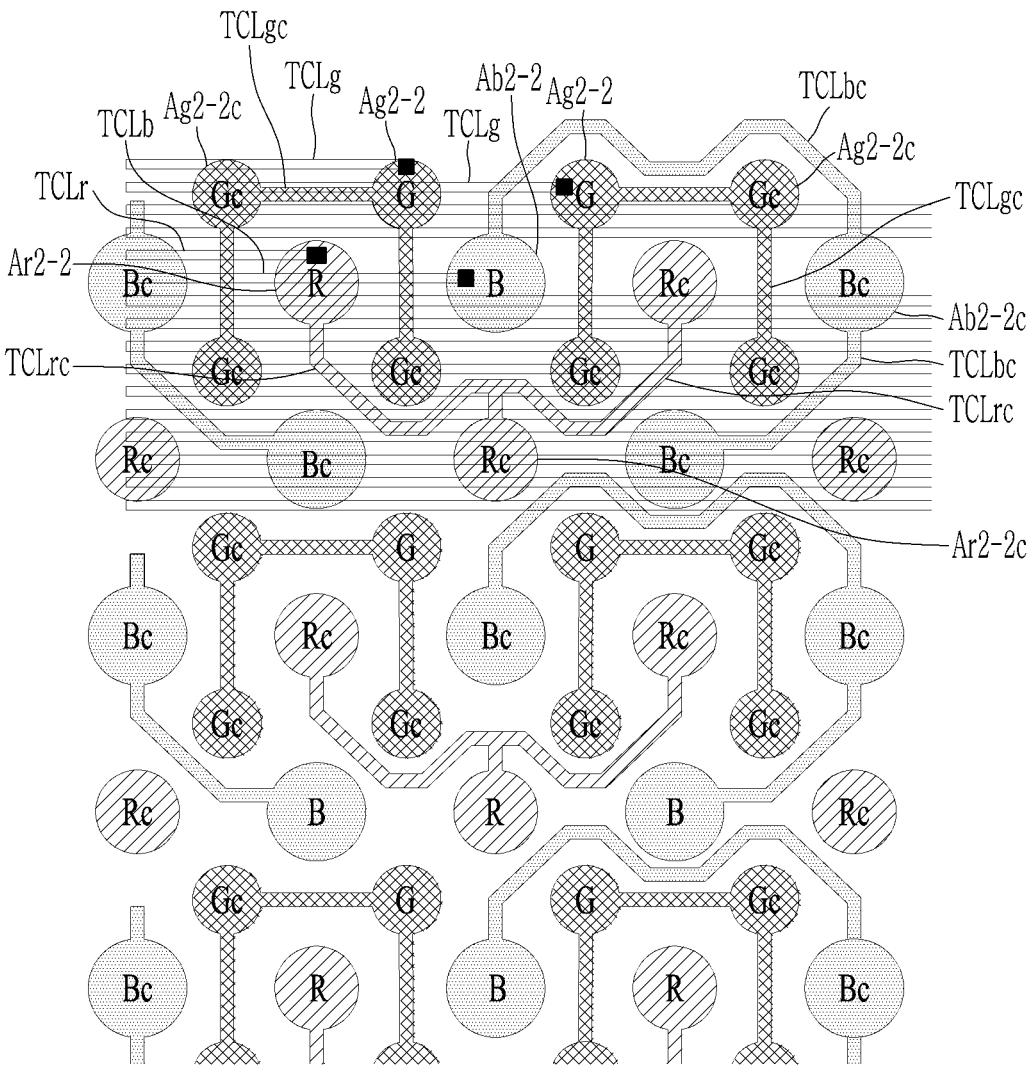
FIG. 5 illustrates an enlarged view of a portion of a second display area in a light emitting display device according to another embodiment.

FIG. 5 illustrates an enlarged view of a portion of a second display area in a light emitting display device according to another embodiment.

FIG. 5 illustrates only the (2-2)-th display area DA2-2, and in some embodiments, the same anode arrangement may also be provided in the (2-1)-th display area DA2-1.

Hereinafter, an embodiment in which the anode of each color is configured as a unit color anode including a plurality of anodes will be described.

In the (2-2)-th display area DA2-2 of FIG. 5, each unit color anode including a plurality of anodes connected to each other is formed. Each unit color anode is configured of one anode Ar2-2, Ag2-2, or Ab2-2 (hereafter referred to as a main anode) directly connected to the transparent wires TCLr, TCLg, and TCLb and the remaining copy anodes Ar2-2c, Ag2-2c, and Ab2-2c (hereinafter also referred to as copy pixel electrodes) electrically connected to the anodes Ar2-2, Ag2-2, and Ab2-2. In the embodiment of FIG. 5, the red and blue unit color anodes Ar2-2, Ar2-2c, Ab2-2, and Ab2-2c are each configured of a total of three anodes, and the green unit color anodes Ag2-2 and Ag2-2c are configured of a total of four anodes. In FIG. 5, additional c is added to the anode of each color to easily confirm the copy anode. For example, on the anode, the red copy anode is shown as Rc, the blue copy anode is shown as Bc, and the green copy anode is shown as Gc. The copy anodes Ar2-2c, Ag2-2c, and Ab2-2c are anodes configuring the copy light emitting element.

The main anodes Ar2-2, Ag2-2, and Ab2-2 and the copy anodes Ar2-2c, Ag2-2c, and Ab2-2c configuring one unit color anode are connected to each other through copy connecting wires TCLrc, TCLgc, and TCLbc.

The copy connecting wires TCLrc, TCLgc, and TCLbc may be made of a transparent conductive material or may be made of the same material as the anode. When the copy connecting wires TCLrc, TCLgc, and TCLbc are made of a transparent conductive material, an area of the light transmitting area LTA of the (2-2)-th display area DA2-2 may be increased.

Although it is illustrated that the transparent connecting wires TCLr, TCLg, and TCLb and the copy connecting wires TCLrc, TCLgc, and TCLbc are formed on different layers and overlap each other in a plan view, they are electrically insulated from each other.

In FIG. 5, the green unit color anodes Ag2-2 and Ag2-2c and the green copy connecting wire TCLgc are connected in an n-shape, the blue unit color anodes Ab2-2 and Ab2-2c are connected to the blue copy connecting wire TCLbc connected along peripheries of the green unit color anodes Ag2-2 and Ag2-2c, and the red unit color anodes Ar2-2 and Ar2-2c are connected to the red copy connecting wire TCLrc formed across two adjacent green unit color anodes Ag2-2 and Ag2-2c.

In some embodiments, the number of unit color anodes may be changed, and the disposition and connection structure of respective colors may also be variously and suitably modified according to embodiments.

As shown in FIG. 5, a position of one main anode Ar2-2, Ag2-2, or Ab2-2 directly connected to the transparent connecting wires TCLr, TCLg, and TCLb in the adjacent anode may be changed within the unit color anode. In some embodiments, in each unit color anode, the main anode Ar2-2, Ag2-2, or Ab2-2 may be positioned at the illustrated position of the main anode Ar2-2, Ag2-2, or Ab2-2 of the unit color anode or at any of the illustrated positions of the copy anodes Ar2-2c, Ag2-2c, or Ab2-2c of the unit color anode.

Although the transparent connecting wires TCLr, TCLg, and TCLb are shown in only some area in FIG. 5, the transparent connecting wires TCLr, TCLg, and TCLb may be further formed to be connected to respective anodes in other areas.

In FIG. 5, a portion in which each anode or each unit color anode is not formed may be the light transmitting area LTA.

Here, a portion of the light transmitting area LTA corresponding to the pixel circuit part and the light emitting element may be formed as an inorganic insulating film without including an organic film. In some embodiments, the light transmitting area LTA may include an organic film in an encapsulation layer (see Encap in FIG. 10) positioned thereon, and may include only the inorganic insulating layer excluding the encapsulation layer.

Hereinafter, the light transmitting area LTA formed as an inorganic insulating film will be described with reference to FIG. 6 and FIG. 7.

First, the embodiment of FIG. 6 will be described.

Figure 6:
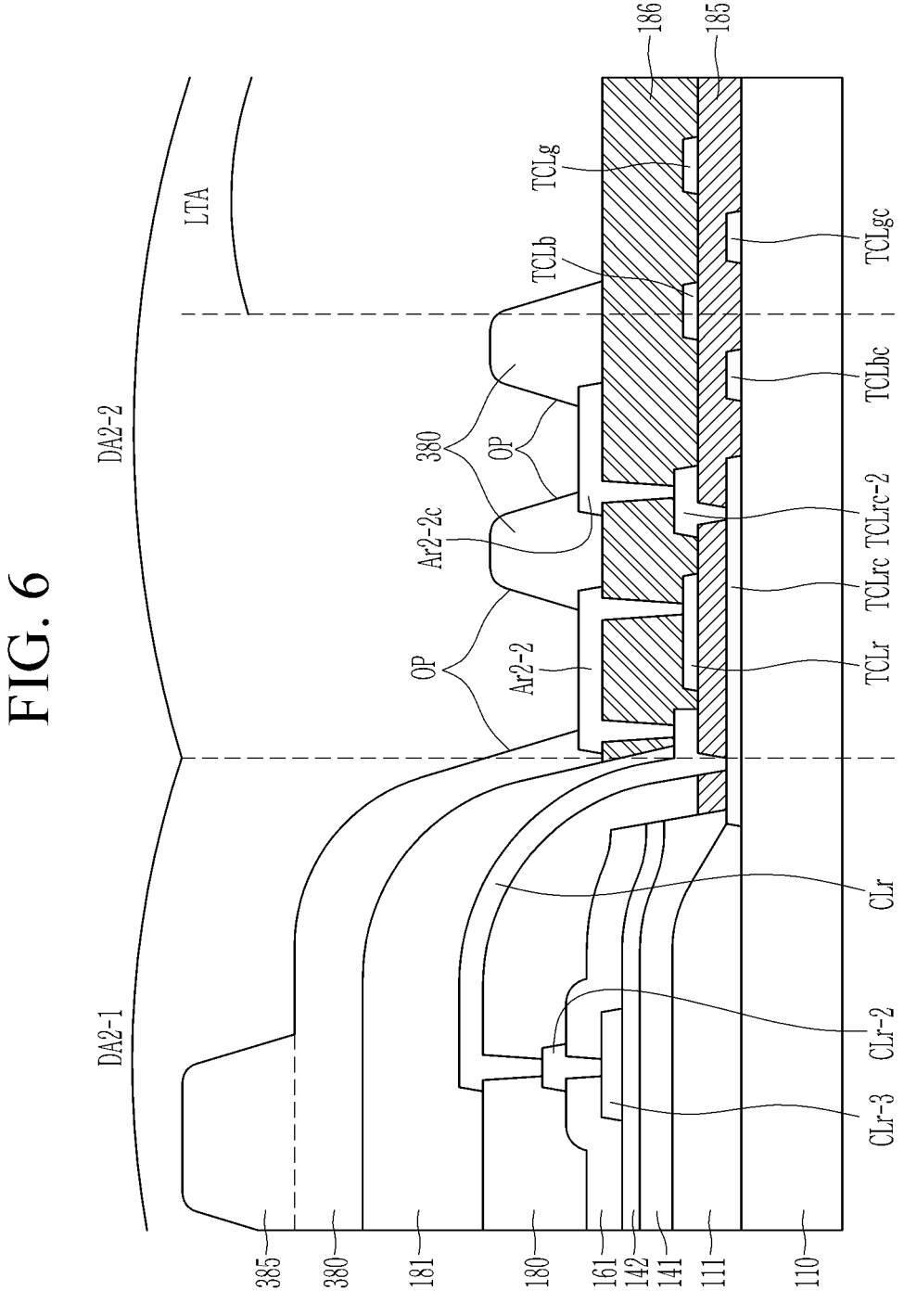
FIG. 6 illustrates a cross-sectional view of a second display area of a light emitting display device according to an embodiment.

FIG. 6 illustrates a cross-sectional view of a second display area of a light emitting display device according to an embodiment.

FIG. 6 illustrates cross-sectional structures of the (2-1)-th display area DA2-1 and the (2-2)-th display area DA2-2, and a cross-sectional structure of the light transmitting area LTA in which no anode is positioned in the (2-2)-th display area DA2-2.

In FIG. 6, only a structure up to the anode of the light emitting element is illustrated along with a structure of the pixel circuit part of the pixel, and the cross-sectional structure of the (2-1)-th display area DA2-1 is briefly illustrated. For example, the pixel circuit part positioned in the (2-1)-th display area DA2-1 includes a transistor and a capacitor to form a semiconductor layer and a conductive layer, which may be the same as a structure of FIG. 10 or FIG. 12 to FIG. 15 to be described later.

The cross-sectional structure of the (2-1)-th display area DA2-1 briefly illustrated in FIG. 6 is as follows, and in FIG. 6, the red pixel circuit part and anode are mainly illustrated.

A buffer layer 111 is positioned on a substrate 110, a first gate insulating film 141 is positioned thereon, and a second gate insulating film 142 and a first interlayer insulating film 161 are sequentially positioned thereon. A first organic film 180 and a second organic film 181 are positioned on the first interlayer insulating film 161. Here, the substrate 110 may be made of a rigid material such as glass to have a non-folding characteristic. However, in some embodiments, a flexible substrate may be utilized.

In the (2-1)-th display area DA2-1 and the first display area DA1, a semiconductor layer is formed on the buffer layer 111, a first gate conductive layer is positioned on the first gate insulating film 141, a second gate conductive layer is positioned on the second gate insulating film 142, a first data conductive layer is positioned on the first interlayer insulating film 161, and a second data conductive layer is positioned on the first organic film 180. An anode is positioned on the second organic film 181, a partition wall 380 is positioned on the anode, and a spacer 385 having a high height may be positioned in a portion of the partition wall 380. Here, a lower portion of the anode, for example, a portion up to the second organic film 181, corresponds to the pixel circuit part, and the anode and an upper portion thereof correspond to the light emitting element.

In the embodiment of FIG. 6, transparent connecting wires TCLr, TCLrc, TCLrc-2, TCLb, TCLbc, TCLg, and TCLgc and connecting portions CLr, CLr-2, and CLr-3 are formed to be connected to the anodes Ar2-2 and Ar2-2c of the (2-2)-th display area DA2-2 from the pixel circuit part PCr2-2 for the (2-2)-th display area of the (2-1)-th display area DA2-1.

In the embodiment of FIG. 6, an output current of the pixel circuit part PCr2-2 for the (2-2)-th display area of the (2-1)-th display area DA2-1 is transmitted to the (2-2)-th display area DA2-2 through the third connecting portion CLr-3 positioned on the second gate conductive layer, the second connecting portion CLr-2 positioned on the first data conductive layer, and the first connecting portion CLr positioned on the second data conductive layer. In the (2-2)-th display area DA2-2, the connecting portions CLr, CLr-2, and CLr-3 are connected to the transparent wires TCLr, TCLrc, TCLrc-2, TCLb, TCLbc, TCLg, and TCLgc to be formed to increase an area of the light transmitting area LTA.

In the embodiment of FIG. 6, in the (2-2)-th display area DA2-2, the pixel circuit part positioned in the (2-1)-th display area DA2-1, and insulating layers (the first organic film 180, the second organic film 181, and the partition wall 380) including (e.g., being) organic materials positioned in the light emitting element are not formed. Therefore, all organic films positioned in the pixel circuit part positioned in the first display area DA1 and the (2-1)-th display area DA2-1 are not included in the light transmitting area LTA and the (2-2)-th display area (DA2-2).

In the embodiment of FIG. 6, the pixel circuit part positioned in the (2-1)-th display area DA2-1 and other insulating layers positioned in the light emitting element are not formed. For example, the insulating layer formed in the (2-1)-th display area DA2-1 and/or the first display area DA1, except for the substrate 110, is not formed in the (2-2)-th display area DA2-2, and a first additional inorganic insulating film 185 and a second additional inorganic insulating film 186 are formed therein. Here, the first additional inorganic insulating film 185 and the second additional inorganic insulating film 186 may include (e.g., be) an inorganic insulating material such as a silicon nitride (SiNx), a silicon oxide (SiOx), and/or a silicon oxynitride (SiOxNy).

In the (2-2)-th display area DA2-2 according to the embodiment of FIG. 6, the first additional inorganic insulating film 185 is positioned on the substrate 110, and the second additional inorganic insulating film 186 is positioned thereon. The first copy connecting wires TCLrc, TCLgc, and TCLbc made of a transparent conductive material are positioned between the substrate 110 and the first additional inorganic insulating film 185, and the transparent connecting wires TCLr, TCLg, and TCLb and the second copy connecting wire TCLrc-2 are positioned between the first additional inorganic insulating film 185 and the second additional inorganic insulating film 186 thereon. The anodes Ar2-2 and Ar2-2c for the (2-2)-th display area may be positioned on the second additional inorganic insulating film 186, and the partition wall 380 having an opening OP exposing a portion of the anodes Ar2-2 and Ar2-2c for the (2-2)-th display area may be positioned on the anodes Ar2-2 and Ar2-2c for the (2-2)-th display area and the second additional inorganic insulating film 186.

In the embodiment of FIG. 6, the first connecting portion CLr extending from the (2-1)-th display area DA2-1 to the (2-2)-th display area DA2-2 is connected to the first copy connecting wire TCLrc through an opening of the first additional inorganic insulating film 185, and it is connected to the anode Ar2-2 for the (2-2)-th display area through an opening of the second additional inorganic insulating film 186. The anode Ar2-2 for the (2-2)-th display area may also be connected to the transparent connecting wire TCLr through an opening of the second additional inorganic insulating film 186. In some embodiments, the first copy connecting wire TCLrc is connected to the second copy connecting wire TCLrc-2 through an opening of the first additional inorganic insulating film 185, and the second copy connecting wire TCLrc-2 is connected to the copy anode Ar2-2*c* for the (2-2)-th display area through an opening of the second additional inorganic insulating film 186.

Referring to FIG. 6, the light transmitting area LTA includes only the substrate 110, the first additional inorganic insulating film 185, and the second additional inorganic insulating film 186, and the copy connecting wires TCLrc, TCLgc, and TCLbc and/or transparent connecting wires TCLr, TCLg, and TCLb made of a transparent conductive material may be positioned in a partial area thereof. An encapsulation layer (see Encap of FIG. 10) may be positioned on the second additional inorganic insulating film 186 in the light transmitting area LTA, and in some embodiments, because an organic film may be included in the encapsulation layer, only the inorganic insulating film may be included excluding the encapsulation layer. In some embodiments, no organic insulation material or layer (or film) is in the light transmitting area LTA, or no organic insulation material or layer (or film) is in the light transmitting area LTA except for one or more organic film in the encapsulation layer Encap. In the light transmitting area LTA, by including only the inorganic insulating film and not including the organic insulating film in the pixel circuit part and a portion corresponding to the light emitting element to utilize the organic insulating film, light transmittance may be prevented from being lowered or the degree that the light transmittance is lowered may be reduced, and thus the light transmittance may be improved.

Hereinafter, an embodiment of FIG. 7, which is different from the embodiment of FIG. 6, will be described.

Figure 7:
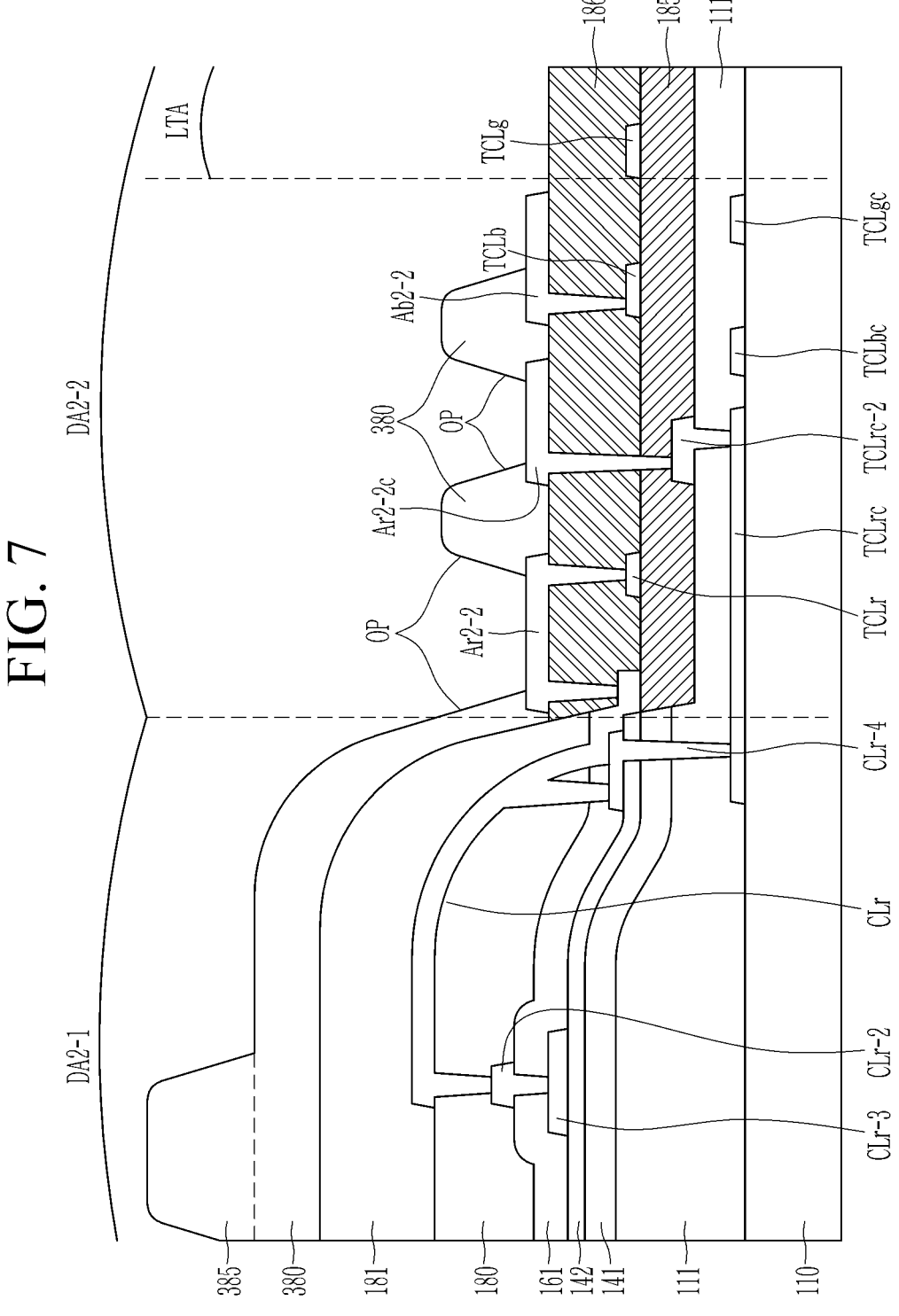
FIG. 7 illustrates a cross-sectional view of a second display area of a light emitting display device according to another embodiment.

FIG. 7 illustrates a cross-sectional view of a second display area of a light emitting display device according to another embodiment.

In FIG. 7, a lower portion of the anode, for example, a portion up to the second organic film 181 corresponds to the pixel circuit part, and the anode and an upper portion thereof correspond to the light emitting element.

In the embodiment of FIG. 7, unlike the embodiment of FIG. 6, the buffer layer 111 is additionally positioned in the (2-2)-th display area DA2-2. The buffer layer 111 is continuously formed from the (2-1)-th display area DA2-1 to the (2-2)-th display area DA2-2. Because the buffer layer 111 is also an inorganic insulating film made of an inorganic insulating material, even in the embodiment of FIG. 7, by including only the inorganic insulating film and not including the organic insulating film in the pixel circuit part and a portion corresponding to the light emitting element to utilize the organic insulating film, light transmittance may be prevented from being lowered or the degree that light transmittance is lowered may be reduced, and thus the light transmittance may be improved. Therefore, all organic films positioned in the pixel circuit part positioned in the first display area DA1 and the (2-1)-th display area DA2-1 are not included in the light transmitting area LTA and the (2-2)-th display area DA2-2. In some embodiments, no organic insulation material or layer (e.g., film) is in the light transmitting area LTA, or no organic insulation material or layer (e.g., film) is in the light transmitting area LTA except for one or more organic films the encapsulation layer Encap.

In the embodiment of FIG. 7, a fourth connecting portion CLr-4 is further formed so that the first connecting portion CLr extending from and/or in the (2-1)-th display area DA2-1 to the (2-2)-th display area DA2-2 may be connected to the first copy connecting wire TCLrc. For example, the fourth connecting portion CLr-4 is connected to the first copy connecting wire TCLrc through an opening formed in the buffer layer 111, the first gate insulating film 141, and the second gate insulating film 142, and the fourth connecting portion CLr-4 is connected to the first connecting portion CLr through an opening positioned in the first interlayer insulating film 161.

Light transmittance of the light transmitting area LTA as in the embodiment of FIG. 6 and FIG. 7 will be described with reference to FIG. 8 and FIG. 9.

Figure 8:
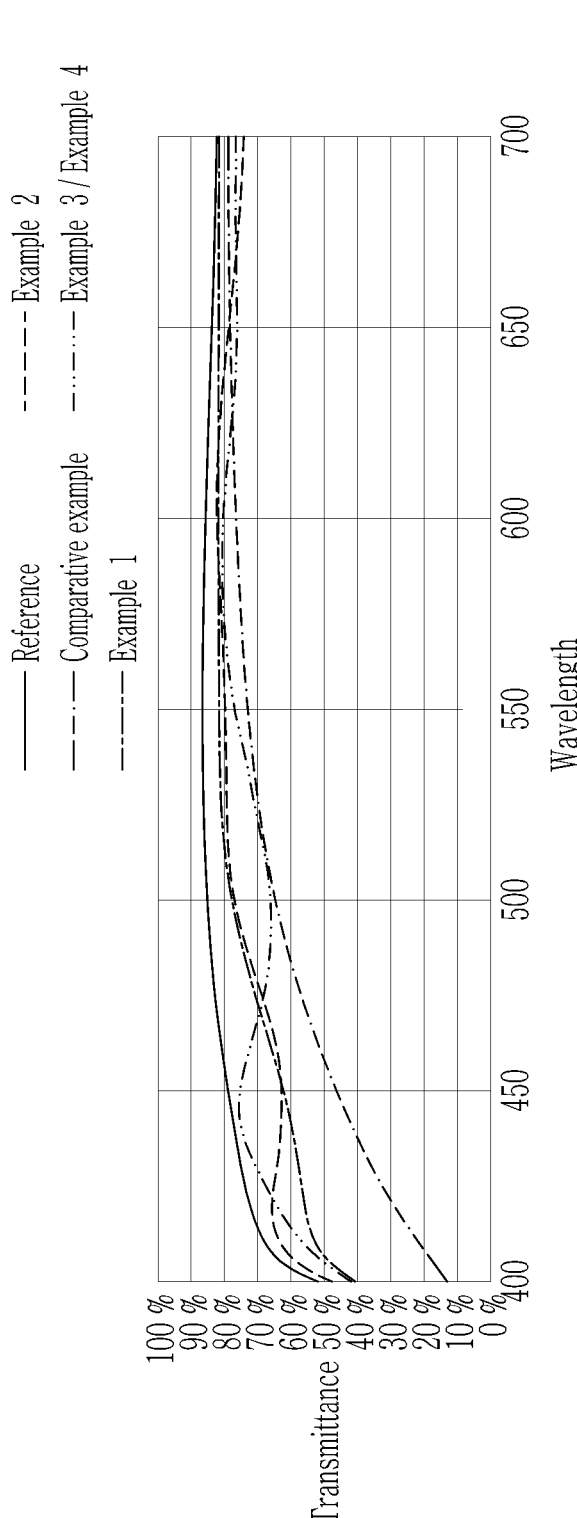
FIG. 8 and FIG. 9 illustrate graphs of transmittance as a function of wavelength in a light transmitting area of the light emitting display device according to the embodiment of FIG. 6 or FIG. 7.
Figure 9:
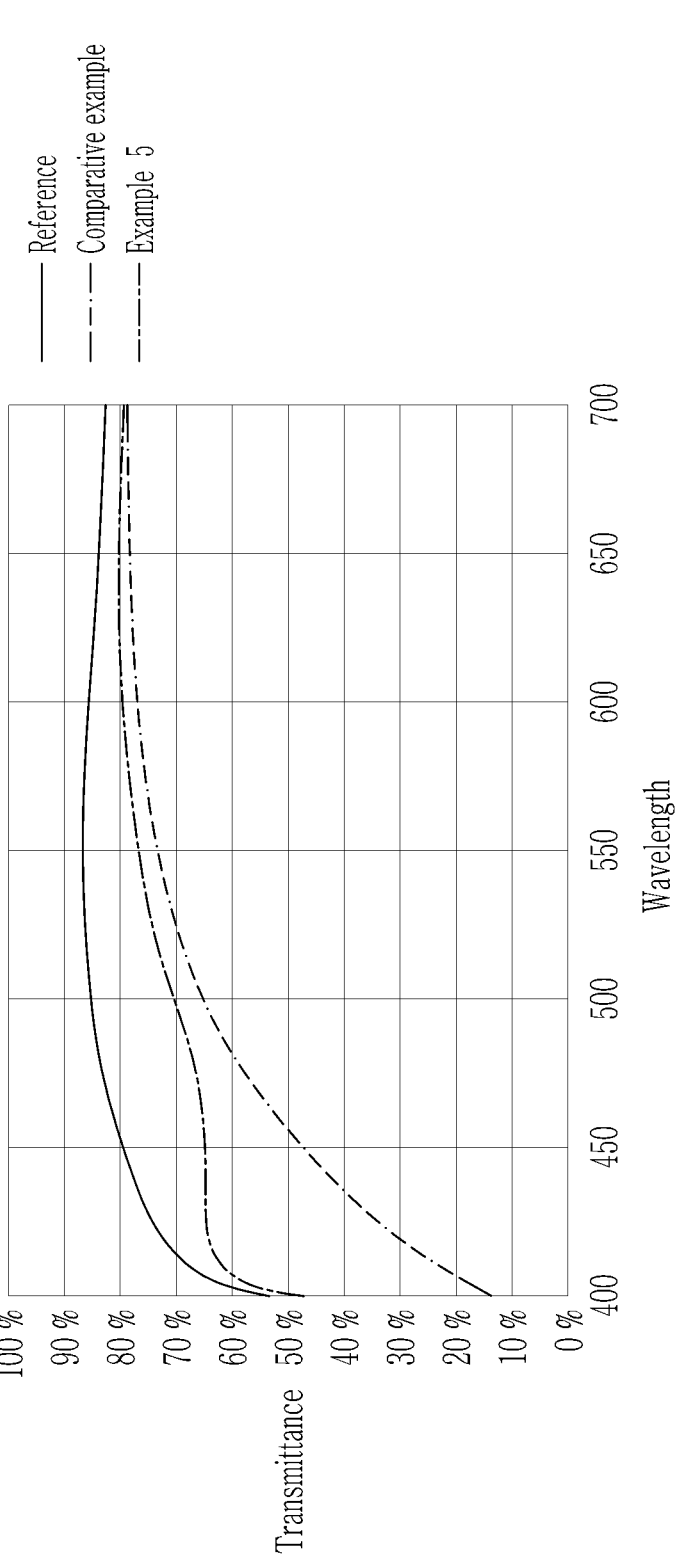

FIG. 8 and FIG. 9 illustrate graphs of transmittance as a function of wavelength in a light transmitting area of the light emitting display device according to the embodiment of FIG. 6 or FIG. 7.

First, the embodiment of FIG. 8 will be described.

FIG. 8 and Table 1 show simulation results of light transmittance for a reference example and a comparative example, and four examples.

Here, the reference example is an example of utilizing a glass substrate and a glass encapsulation substrate thereon and thereunder, and in the light transmitting area positioned therebetween, a separate layer is not formed, so that the light transmitting area has high transmittance. However, in order to form a thinner and lighter display device, the transmittance is relatively reduced in the light transmitting area LTA of a display device, which is formed with an encapsulation layer including an inorganic film and an organic film instead of a glass encapsulation substrate.

The comparative example is an example in which the first organic film 180 and the second organic film 181 positioned in the (2-1)-th display area DA2-1 are continuously formed up to and into the light transmitting area LTA, and the additional inorganic insulating film (the first additional inorganic insulating film 185 and the second additional inorganic insulating film 186) is not included.

Example 1 and Example 2 are examples in which the buffer layer 111 is not included in the light transmitting area LTA as shown in FIG. 6, and Example 1 is an example in which the first additional inorganic insulating film 185 and the second additional inorganic insulating film 186 are made of a silicon oxide (SiOx), and Example 2 is an example in which the first additional inorganic insulating film 185 and the second additional inorganic insulating film 186 are made of a silicon nitride (SiNx).

Example 3 and Example 4 are examples in which the buffer layer 111 is also formed in the light transmitting area LTA as shown in FIG. 7, Example 3 is an example in which the first additional inorganic insulating film 185 and the second additional inorganic insulating film 186 are made of a silicon oxide (SiOx), and Example 4 is an example in which the first additional inorganic insulating film 185 and the second additional inorganic insulating film 186 are made of a silicon nitride (SiNx).

Light transmittance simulated in one or more suitable wavelength bands for the reference example, the comparative example, and Example 1 to Example 4 are shown in Table 1 and FIG. 8.

TABLE 1

| | Reference example | Comparative example | Example 1 | Example 2 | Example 3 | Example 4 |
|---|---|---|---|---|---|---|
| Full wavelength | 81.16% | 63.02% | 73.82% | 73.84% | 72.54% | 72.54% |
| 440-460 nm | 77.52% | 42.95% | 60.72% | 63.17% | 74.23% | 74.23% |
| 490-510 nm | 84.27% | 62.53% | 75.77% | 75.17% | 66.17% | 66.17% |
| 540-560 nm | 86.11% | 71.98% | 81.62% | 79.14% | 75.10% | 75.10% |
| 590-610 nm | 85.41% | 76.14% | 81.40% | 81.67% | 80.15% | 80.15% |
| 640-660 nm | 83.94% | 77.87% | 80.95% | 79.36% | 79.10% | 79.10% |
| Ripple | 2.22% | 5.89% | 0.81% | 2.88% | 5.01% | 5.01% |

In Table 1, the ripple represents a variation range between a maximum or largest value and a minimum or smallest value of light transmittance, and is a value in the wavelength band of 550-650 nm. The larger the value of the ripple, the larger the variation of light transmittance, so the performance of the optical element OS may become relatively low.

Referring to Table 1, the simulation result values of Example 3 and Example 4 may each independently be the same, but it is not clear whether the simulation result is appropriate or suitable. Accordingly, additional simulations were performed as shown in FIG. 9 and Table 2.

Hereinafter, FIG. 9 and Table 2 will be described.

A reference example and a comparative example in FIG. 9 and Table 2 may each independently be the same as those in FIG. 8. In FIG. 9 and Table 2, Example 5 corresponds to Example 3 of Table 1, and it is an example in which the first additional inorganic insulating film 185 and the second additional inorganic insulating film 186 are made of a silicon oxide (SiOx).

TABLE 2

| | Reference example | Comparative example | Example 5 |
|---|---|---|---|
| Full wavelength | 81.16% | 63.02% | 72.05% |
| 440-460 nm | 77.52% | 42.95% | 64.36% |
| 490-510 nm | 84.27% | 62.53% | 68.61% |
| 540-560 nm | 86.11% | 71.98% | 75.28% |
| 590-610 nm | 85.41% | 76.14% | 78.83% |
| 640-660 nm | 83.94% | 77.87% | 79.47% |
| Ripple | 2.22% | 5.89% | 4.17% |

Referring to FIG. 8 and FIG. 9 and Table 1 and Table 2, even when an encapsulation layer formed with an organic film and an inorganic film is utilized in a display panel utilizing a glass substrate, by not including an organic film in a portion corresponding to the pixel circuit part and light emitting element of the light transmitting area LTA, it is possible to have overall improved light transmittance compared with the comparative example. In FIG. 8 and Table 1, an example having the higher light transmittance and low ripple is Example 1, which does not include the buffer layer 111 in a portion corresponding to the pixel circuit part and the light emitting element of the light transmitting area LTA, and in which the first additional inorganic insulating film 185 and the second additional inorganic insulating film 186 are made of a silicon oxide (SiOx). Example 1 has a low ripple value compared with other comparative examples and other examples, so that the performance of the optical element OS may be substantially uniform in one or more suitable wavelength bands. Although Example 1 may be utilized to form a structure with the highest light transmittance in the light transmitting area LTA of the display device, even when other examples are utilized, the light transmittance is higher than that of the comparative example.

In some embodiments, an inorganic insulating film made of a silicon oxide (SiOx) and an inorganic insulating film made of a silicon nitride (SiNx) may be utilized together.

However, the transmittance of Example 1 also does not reach the transmittance of the reference example, and unlike the reference example that utilizes a glass substrate as an encapsulation layer, the encapsulation layer of the example includes an organic film, so that the transmittance thereof is lower than the transmittance of the reference example due to light loss occurring in the encapsulation layer.

Comparing the comparative example and Example 1 to Example 5, it can be seen that the light transmittance is improved to about 10% or less, and it can be seen that Example 1 to Example 4 have an improved light transmittance of 20% to 30% compared with the comparative examples when viewed based on each wavelength band.

In the above, the light transmittance of the light transmitting area LTA has been described focusing on the embodiment in which the substrate 110 is a rigid substrate that is not folded, such as a glass substrate.

Hereinafter, an embodiment in which the substrate 110 is a flexible substrate will be described with reference to FIG. 10 and FIG. 11.

Figure 10:
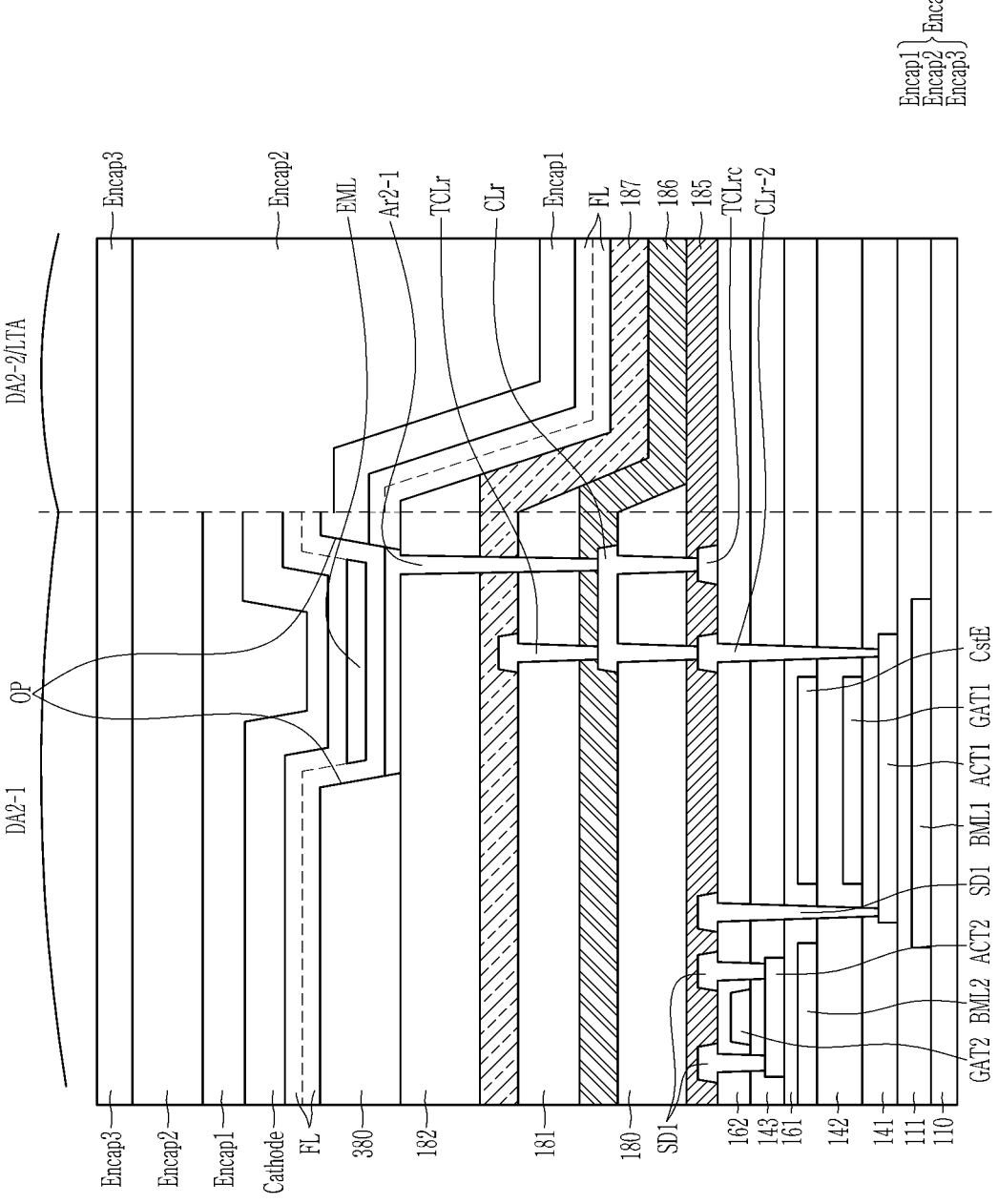
FIG. 10 illustrates a cross-sectional view of a second display area of a light emitting display device according to another embodiment.

FIG. 10 illustrates a cross-sectional view of a second display area of a light emitting display device according to another embodiment.

FIG. 10 illustrates a cross-sectional structure of the light transmitting area LTA of the (2-1)-th display area DA2-1 and the (2-2)-th display area DA2-2, and illustrates, unlike as is illustrated in FIG. 6 and FIG. 7, a structure up to and including an encapsulation layer Encap on the anode.

Figure 12:
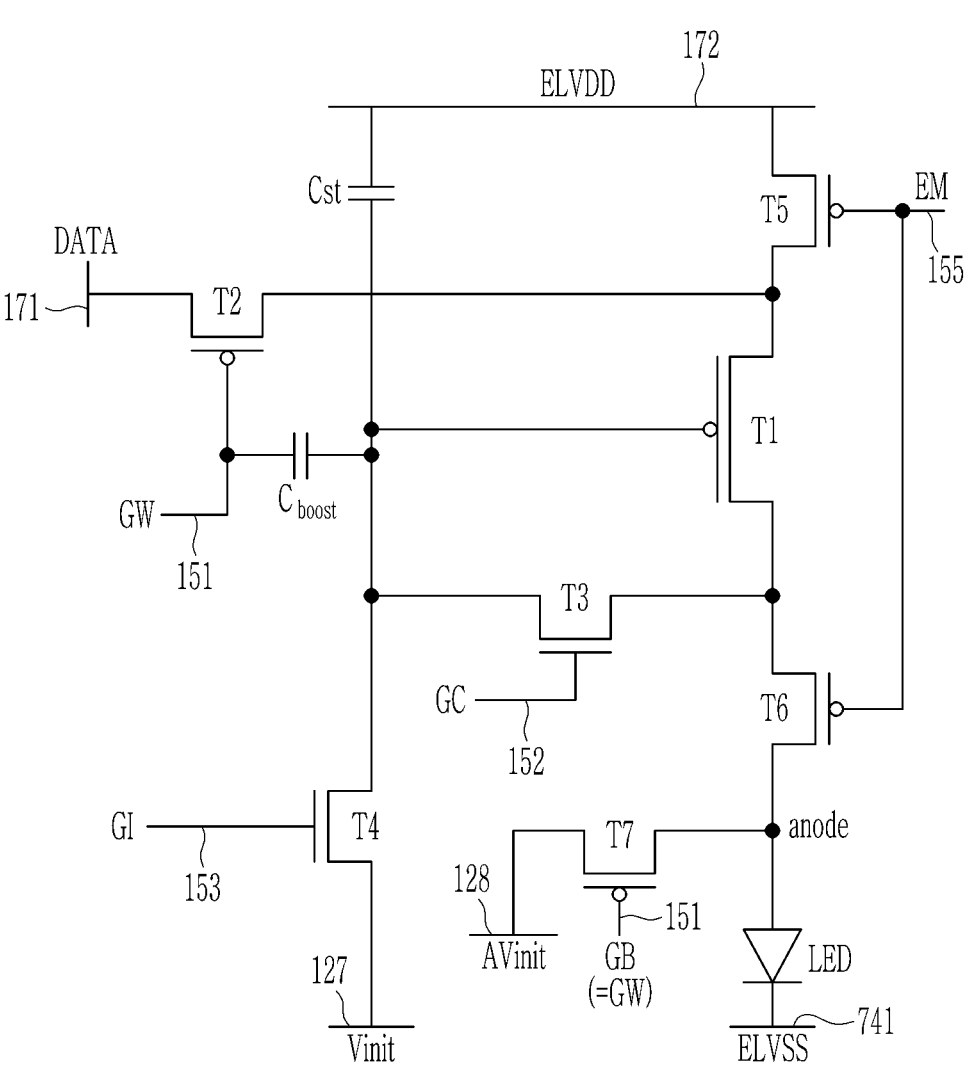
FIG. 12 illustrates a circuit diagram of one pixel included in a light emitting display device according to an embodiment.
Figure 13:
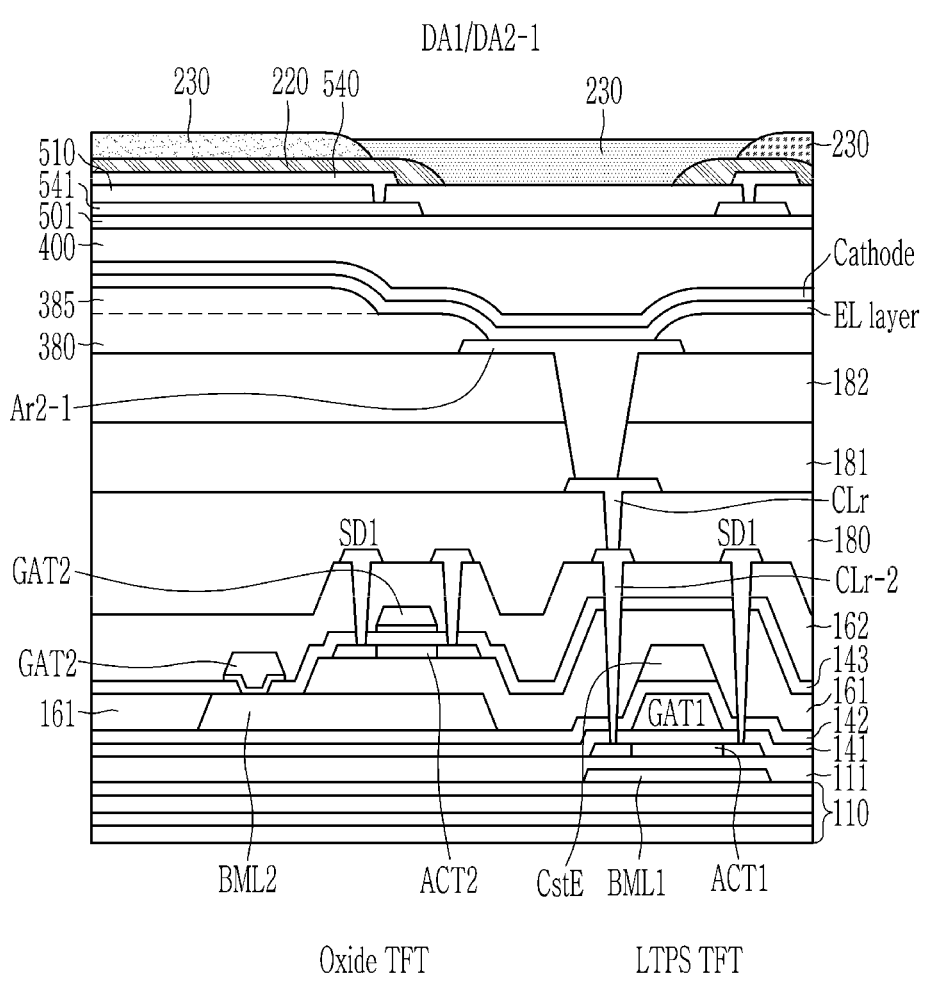
FIG. 13 illustrates a cross-sectional view of the pixel according to the embodiment of FIG. 12.

In some embodiments, the cross-sectional structure of the pixel circuit part and the light emitting element of the (2-1)-th display area DA2-1 is one according to the pixel circuit part including two different semiconductor layers ACT1 and ACT2 according to an embodiment, and a more detailed structure of the pixel circuit part may correspond to FIG. 12 and FIG. 13. In some embodiments, the pixel circuit part and light emitting element of the first display area DA1 may also have the same structure as the pixel circuit part and light emitting element of the (2-1)-th display area DA2-1, and it may correspond to FIG. 12 and FIG. 13.

The pixel circuit part positioned in the (2-1)-th display area DA2-1 includes transistors having two different characteristics and additionally includes a capacitor, and a more detailed structure thereof may be the same as that of FIG. 12 and FIG. 13.

The cross-sectional structure of the (2-1)-th display area DA2-1 schematically illustrated with reference to FIG. 10 is as follows, and the red pixel circuit part and the anode (light emitting device) are mainly illustrated.

A buffer layer 111 is positioned on a substrate 110, a first gate insulating film 141 is positioned thereon, and a second gate insulating film 142 and a first interlayer insulating film 161 are sequentially positioned thereon. A third gate insulating film 143 and a second interlayer insulating film 162 are positioned on the first interlayer insulating film 161, a first additional inorganic insulating film 185 is positioned thereon, a first organic film 180 is positioned thereon, and a second additional inorganic insulating film 186, a second organic film 181, a third additional inorganic insulating film 187, and a third organic film 182 are sequentially positioned thereon. Here, the substrate 110 may be formed of a flexible substrate such as plastic and/or polyimide (PI) and may have a folding feature (e.g., be foldable). However, in some embodiments, it is formed of a rigid material such as glass, so that it may not be folded (e.g., so that it is not foldable).

In the (2-1)-th display area DA2-1, a first metal layer BML1 is positioned between the substrate 110 and the buffer layer 111, a first semiconductor layer ACT1 is formed on the buffer layer 111, a first gate conductive layer including a first gate electrode GAT1 is positioned on the first gate insulating film 141, a second gate conductive layer including a storage capacitor electrode CstE and a second metal layer BML2 is positioned on the second gate insulating film 142, a second semiconductor layer ACT2 is positioned on the first interlayer insulating film 161, and a third gate conductive layer including a second gate electrode GAT2 is positioned on the third gate insulating film 143. A first data conductive layer and a first copy connecting wire TCLrc including a connecting electrode SD1 electrically connected to the semiconductor layers ACT1 and ACT2 of each transistor and a second connecting portion CLr-2 to transmit an output current are positioned on the second interlayer insulating film 162, a first connecting portion CLr is positioned on the first additional inorganic insulating film 185, and a transparent connecting wire TCLr is positioned on the second organic film 181. An anode Ar2-1 is positioned on the third organic film 182, and a partition wall 380 having an opening OP partially exposing the anode Ar2-1 is positioned on the anode Ar2-1 and the third organic film 182. The partition wall 380 may further include a spacer having a high height (e.g., a height higher than an adjacent portion of the partition wall 380) in a partial area thereof. Here, a lower portion of the anode Ar2-1, for example, a portion up to the third organic film 182 corresponds to the pixel circuit part, and the anode Ar2-1 and an upper portion thereof correspond to the light emitting element. In some embodiments, an upper portion of the anode Ar2-1 corresponds to the light emitting element and a lower portion of the anode Ar2-1 corresponds to the pixel circuit part.

A light emitting layer EML is positioned in the opening OP of the partition wall 380, and a functional layer FL is positioned above and/or below the light emitting layer EML. The light emitting layer EML and the functional layer FL are also referred to as an intermediate layer (EL layer in FIG. 13).

A cathode (Cathode; also referred to as an opposite electrode) is positioned on the functional layer FL, and an encapsulation layer Encap is positioned on the cathode (Cathode). The encapsulation layer Encap may include a plurality of layers, and in this case, it may be formed as a composite film including both (e.g., simultaneously) an inorganic layer and an organic layer, and for example, it may be formed as a triple layer in which a first encapsulation inorganic layer Encap1, an encapsulation organic layer Encap2, and a second encapsulation inorganic layer Encap3 are sequentially formed.

In the (2-1)-th display area DA2-1 of FIG. 10, unlike FIG. 6 and FIG. 7, the additional inorganic insulating films 185, 186, and 187 positioned in the (2-2)-th display area DA2-2 extend up to and into the (2-1)-th display area DA2-1, and the additional inorganic insulating films 185, 186, and 187 may also extend to and/or into the first display area DA1.

The transparent connecting wires TCLr and TCLrc and the connecting portions CLr and CLr-2 positioned in the (2-1)-th display area DA2-1 of FIG. 10 may be electrically connected to the anode positioned in the (2-2)-th display area DA2-2 as shown in FIG. 6 or FIG. 7.

In the embodiment of FIG. 10, the first connecting portion CLr is connected to the second connecting portion CLr-2 and the first copy connecting wire TCLrc through an opening formed in the first organic film 180 and the first additional inorganic insulating film 185 in the (2-1)-th display area DA2-1. The first copy connecting wire TCLrc is made of a transparent conductive material and may extend to and into the (2-2)-th display area DA2-2 to be electrically connected to the copy anode for the (2-2)-th display area.

On the other hand, the first connecting portion CLr is connected to the transparent connecting wire TCLr by an opening positioned in the second additional inorganic insulating film 186 and the second organic film 181, and is connected to the anode Ar2-1 through an opening positioned in the second additional inorganic insulating film 186, the second organic film 181, the third additional inorganic insulating film 187, and the third organic film 182. The transparent connecting wire TCLr is made of a transparent conductive material and may extend to and into the (2-2)-th display area DA2-2 to be electrically connected to the anode for the (2-2)-th display area. The structure in which the transparent connecting wires TCLr and TCLrc and the connecting portions CLr and CLr-2 are connected to the anode may be formed in one or more suitable ways.

In the embodiment of FIG. 10, in the (2-2)-th display area DA2-2, the pixel circuit part positioned in the (2-1)-th display area DA2-1, and insulating layers (the first organic film 180, the second organic film 181, the third organic film 182, and the partition wall 380) including (e.g., being) organic materials positioned in the light emitting element are not formed. Therefore, all organic films positioned in the pixel circuit part positioned in the first display area DA1 and the (2-1)-th display area DA2-1 are not included in the light transmitting area LTA and the (2-2)-th display area (DA2-2). In some embodiments, no organic material or layer (or film) may be in the (2-2)-th display area DA2-2 and the light transmitting area LTA except for the encapsulation organic layer Encap2. On the other hand, in the embodiment of FIG. 10, another inorganic insulating film positioned in the pixel circuit part positioned in the (2-1)-th display area DA2-1 extends to be formed in the (2-2)-th display area DA2-2. However, in some embodiments, another inorganic insulating film positioned in the pixel circuit part positioned in the (2-1)-th display area DA2-1 may not be formed in the (2-2)-th display area DA2-2.

In the stacked structure of the light transmitting area LTA in the (2-2)-th display area DA2-2 of FIG. 10, the insulating layers (the first organic film 180, the second organic film 181, the third organic film 182, and the partition wall 380) including (e.g., being) an organic material formed in the (2-1)-th display area DA2-1 and/or the first display area DA1 are not formed in the (2-2)-th display area DA2-2, and the other layers are formed in substantially the same manner as in the (2-1)-th display area DA2-1. Here, the first additional inorganic insulating film 185, the second additional inorganic insulating film 186, the third additional inorganic insulating film 187, and other inorganic insulating films (the buffer layer 111, the first gate insulating film 141, the second gate insulating film 142, the third gate insulating film 143, the first interlayer insulating film 161, and the second interlayer insulating film 162) may include (e.g., be) inorganic insulating materials such as a silicon nitride (SiNx), a silicon oxide (SiOx), a silicon oxynitride (SiOxNy), and/or the like.

In the light transmitting area LTA of the (2-2)-th second display area DA2-2 according to the embodiment of FIG. 10, the buffer layer 111, the first gate insulating film 141, the second gate insulating film 142, the first interlayer insulating film 161, the third gate insulating film 143, and the second interlayer insulating film 162 are sequentially stacked on the substrate 110, and the first additional inorganic insulating film 185, the second additional inorganic insulating film 186, and the third additional inorganic insulating film 187 are sequentially positioned thereon. The functional layer FL is positioned on the third additional inorganic insulating film 187, and the encapsulation layer Encap is positioned on the functional layer FL. The functional layer FL may include (e.g., be) an inorganic material, and in some embodiments, the functional layer FL may be excluded from the (2-2)-th display area DA2-2 and the light transmitting area LTA. The encapsulation layer Encap is formed as a triple layer in which the first encapsulation inorganic layer Encap1, the encapsulation organic layer Encap2, and the second encapsulation inorganic layer Encap3 are sequentially formed, and an organic insulating material is included in the encapsulation organic layer Encap2. Because a function of the encapsulation layer Encap is to block or reduce oxygen and/or moisture from flowing into the light emitting layer EML, it is difficult to remove the encapsulation organic layer Encap2 made of an organic insulating material from the encapsulation layer Encap. Accordingly, the organic layer may be formed only on the encapsulation layer in the light transmitting area LTA, and only the inorganic insulating film may be included in the other areas. In the light transmitting area LTA, by including only the inorganic insulating film and not including the organic insulating film in the pixel circuit part and a portion corresponding to the light emitting element to utilize the organic insulating film, light transmittance may be prevented from being lowered or the degree that light transmittance is lowered may be reduced, and thus the light transmittance may be improved.

The transparent connecting wires TCLr and TCLrc made of a transparent conductive material may be positioned in the light transmitting area LTA depending on a position thereof. In some embodiments, unlike FIG. 10, a portion of the inorganic insulating film may not be provided in the light transmitting area LTA.

Light transmittance of the light transmitting area LTA as in the embodiment of FIG. 10 will be described with reference to FIG. 11.

Figure 11:
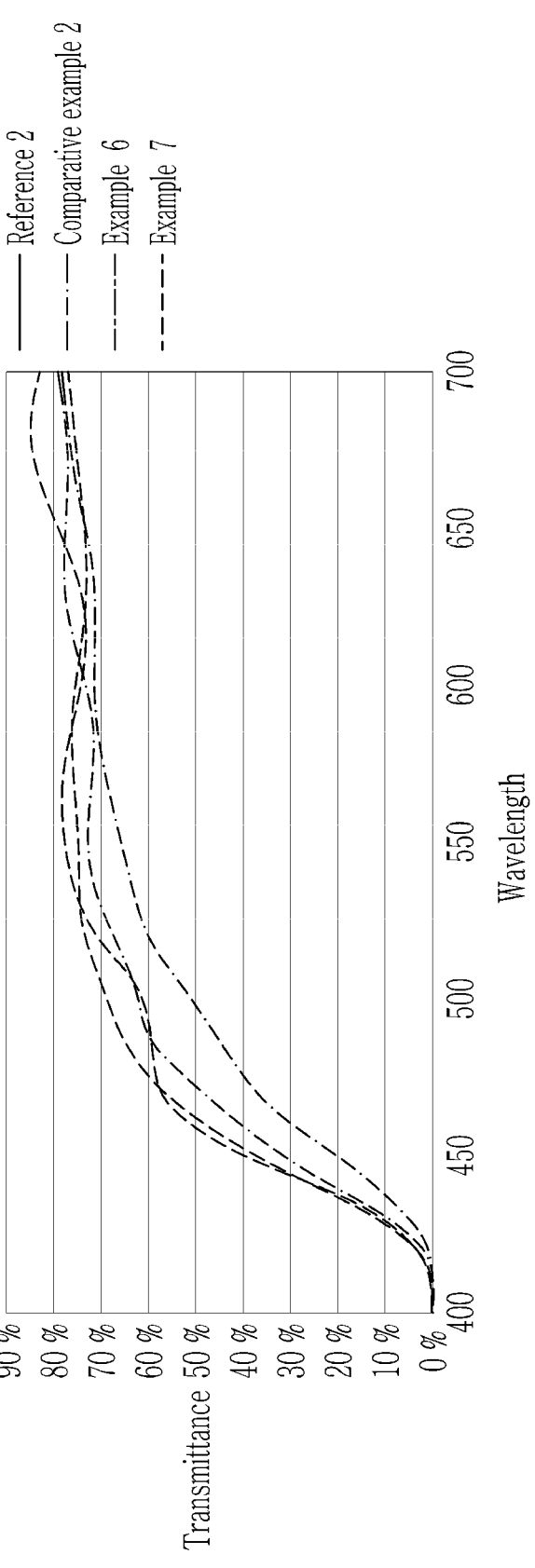
FIG. 11 illustrates a graph of transmittance as a function of wavelength in a light transmitting area of the light emitting display device according to the embodiment of FIG. 10.

FIG. 11 illustrates a graph of transmittance as a function of wavelength in a light transmitting area of the light emitting display device according to the embodiment of FIG. 10.

FIG. 11 and Table 3 below show the simulation results of light transmittance for Reference 2 and Comparative Example 2, and two examples.

Here, Reference 2 utilizes a flexible substrate, so a glass substrate is not utilized, and it has lower transmittance than the reference example in Table 1 and Table 2 in which a glass substrate is utilized.

Comparative Example 2 is an example in which the first organic film 180, the second organic film 181, and the third organic film 182 positioned in the (2-1)-th display area DA2-1 are continuously formed up to and into the light transmitting area LTA, and the additional inorganic insulating film (the first additional inorganic insulating film 185, the second additional inorganic insulating film 186, and third additional inorganic insulating film 187) is not included.

Example 5 and Example 6, as shown in FIG. 10, are examples in which all inorganic insulating films excluding the organic films (the first organic film 180, the second organic film 181, and the third organic film 182) among all insulating layers positioned in the pixel circuit part of the (2-1)-th display area DA2-1 in the light transmitting area LTA are formed. In this case, Example 6 is an example in which the additional inorganic insulating films (the first additional inorganic insulating film 185, the second additional inorganic insulating film 186, and the third additional inorganic insulating film 187) are made of a silicon oxide (SiOx), and Example 7 is an example in which the additional inorganic insulating films (the first additional inorganic insulating film 185, the second additional inorganic insulating film 186, and the third additional inorganic insulating film 187) are made of a silicon nitride (SiNx).

Light transmittance simulated in one or more suitable wavelength bands for Reference 2, Comparative Example 2, Example 6, and Example 7 are shown in Table 3 below and FIG. 11.

TABLE 3

| | Reference 2 | Comparative Example 2 | Example 6 | Example 7 |
|---|---|---|---|---|
| Full wavelength | 58.71% | 53.42% | 62.14% | 61.02% |
| 440-460 nm | 30.27% | 20.12% | 38.04% | 37.24% |
| 490-510 nm | 62.30% | 51.25% | 61.95% | 68.72% |
| 540-560 nm | 71.82% | 64.72% | 76.56% | 74.74% |
| 590-610 nm | 73.45% | 71.59% | 74.56% | 75.19% |
| 640-660 nm | 76.88% | 73.39% | 79.03% | 73.60% |
| Ripple | 5.37% | 7.72% | 5.70% | 3.06% |

In Table 3, the ripple represents a variation range between a maximum or largest value and a minimum or smallest value of light transmittance, and is a value in the wavelength band of 550-650 nm. The larger the value of the ripple, the larger the variation of light transmittance, so the performance of the optical element OS may become relatively low.

Referring to FIG. 11 and Table 3, even when an encapsulation layer formed with an organic film and an inorganic film is utilized in a display device utilizing a flexible substrate, by not including an organic film in a portion corresponding to the pixel circuit part and light emitting element of the light transmitting area LTA, it is possible to have overall improved light transmittance compared with Comparative Example 2. In FIG. 11 and Table 3, an example having the highest light transmittance is Example 6, in which the first additional inorganic insulating film 185, the second additional inorganic insulating film 186, and the third additional inorganic insulating film 187 are made of a silicon oxide (SiOx). Example 7 has a low ripple value compared with other comparative examples and other examples, so that the performance of the optical element OS may be substantially uniform in one or more suitable wavelength bands. In some embodiments, an inorganic insulating film made of a silicon oxide (SiOx) and an inorganic insulating film made of a silicon nitride (SiNx) may be utilized together.

Comparing Comparative Example 2 and Example 6 and Example 7, it can be confirmed that the light transmittance is improved to about 9% or less on average, and when viewed based on each wavelength band, it can be confirmed that the light transmittance of Example 6 and Example 7 are improved to about 18% or less compared with that of Comparative Example 2.

Hereinafter, a circuit structure and a cross-sectional structure according to one or more suitable embodiments of a pixel including a pixel circuit part and a light emitting element formed in the first display area DA1 will be described with reference to FIG. 12 to FIG. 15. The following FIG. 12 to FIG. 15 may also be applied to the structure of the (2-1)-th display area DA2-1.

First, a pixel utilizing two semiconductor layers will be described with reference to FIG. 12 and FIG. 13.

FIG. 12 illustrates a circuit diagram of one pixel included in a light emitting display device according to an embodiment, and FIG. 13 illustrates a cross-sectional view of the pixel according to the embodiment of FIG. 12.

First, a circuit structure of one pixel including the pixel circuit part and the light emitting element will be described with reference to FIG. 12.

The circuit structure illustrated in FIG. 12 is a circuit structure of the pixel circuit part and the light emitting element formed in the first display area DA1 (normal display area) and the (2-1)-th display area DA2-1 (intermediate display area).

One pixel according to the embodiment of FIG. 12 includes transistors T1, T2, T3, T4, T5, T6, and T7, a storage capacitor Cst, a boost capacitor $C_{boost}$, and a light emitting element LED connected to a plurality of wires 127, 128, 151, 152, 153, 155, 171, 172, and 741. Here, the transistors and the capacitors, which are remaining elements excluding the light emitting element LED, form a pixel circuit part. In some embodiments, the boost capacitor $C_{boost}$ may not be provided.

The plurality of wires 127, 128, 151, 152, 153, 155, 171, 172, and 741 are connected to one pixel PX. The plurality of wires includes a first initialization voltage line 127, a second initialization voltage line 128, a first scan line 151, a second scan line 152, an initialization control line 153, a light emitting signal line 155, a data line 171, a driving voltage line 172, and a common voltage line 741. In the embodiment of FIG. 12, the first scan line 151 connected to the seventh transistor T7 is also connected to the second transistor T2, but in some embodiments, the seventh transistor T7, unlike the second transistor T2, may be connected to a bypass control line.

The first scan line 151 is connected to a scan driver to transmit a first scan signal GW to the second transistor T2 and the seventh transistor T7. The second scan line 152 may be applied with a voltage of an opposite polarity to a voltage applied to the first scan line 151 at the same timing as that of a signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The light emitting signal line 155 transmits a light emitting control signal EM to the fifth transistor T5 and the sixth transistor T6.

The data line 171 is a line that transmits a data voltage DATA generated by a data driver, and thus, as an amount of a current transmitted to the light emitting element LED is changed, luminance emitted by the light emitting element LED is also changed. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to a cathode of the light emitting element LED. In the present embodiment, each of voltages applied to the driving voltage line 172, the first and second initialization voltage lines 127 and 128, and the common voltage line 741 may be a constant voltage.

Transistors included in the pixel may be divided into two types (kinds) of transistors. In some embodiments, the driving transistor T1, the second transistor T2, the fifth transistor T5, the sixth transistor T6, and the seventh transistor T7 are p-type or kind transistors including a polycrystalline semiconductor, and may be turned on by a low voltage. In some embodiments, the third transistor T3 and the fourth transistor T4 are n-type or kind transistors including an oxide semiconductor, and may be turned on by a high voltage.

The driving transistor T1 (also referred to as the first transistor) is a p-type or kind transistor, and has a silicon semiconductor as a semiconductor layer. It is a transistor that adjusts the amount of light emitting current outputted to the anode of the light emitting element LED according to a voltage (for example, a voltage stored in the storage capacitor Cst) of a gate electrode of the driving transistor T1. Because brightness of the light emitting element LED is adjusted according to an amount of a light emitting current outputted to the anode electrode of the light emitting element LED, light emitting luminance of the light emitting element LED may be adjusted according to the data voltage DATA applied to the pixel. For this purpose, a first electrode of the driving transistor T1 is positioned to receive the driving voltage ELVDD, and is connected to the driving voltage line 172 via the fifth transistor T5. In some embodiments, the first electrode of the driving transistor T1 is connected to a second electrode of the second transistor T2 to receive the data voltage DATA. In some embodiments, a second electrode of the driving transistor T1 outputs the light emitting current to the light emitting element LED, and is connected to the anode of the light emitting element LED via the sixth transistor T6 (hereinafter referred to as an output control transistor). In some embodiments, the second electrode of the driving transistor T1 is also connected to the third transistor T3 to transmit the data voltage DATA applied to the first electrode thereof to the third transistor T3. In some embodiments, a gate electrode of the driving transistor T1 is connected to one electrode of the storage capacitor Cst (hereinafter referred to as a 'second storage electrode'). A voltage of the gate electrode of the driving transistor T1 is changed according to a voltage stored in the storage capacitor Cst, and accordingly, a light emitting current outputted from the driving transistor T1 is changed. The storage capacitor Cst serves to maintain the voltage of the gate electrode of the driving transistor T1 constant for one frame. In some embodiments, the gate electrode of the driving transistor T1 may also be connected to the third transistor T3 so that the data voltage DATA applied to the first electrode of the driving transistor T1 passes through the third transistor T3 to be transmitted to the gate electrode of the driving transistor T1. In some embodiments, the gate electrode of the driving transistor T1 may also be connected to the fourth transistor T4 to be initialized by receiving the first initialization voltage Vinit.

The second transistor T2 is a p-type or kind transistor, and has a silicon semiconductor as a semiconductor layer. The second transistor T2 is a transistor that allows the data voltage DATA to be received into the pixel. A gate electrode of the second transistor T2 is connected to the first scan line 151 and one electrode of the boost capacitor $C_{boost}$ (hereinafter referred to as a 'lower boost electrode'). A first electrode of the second transistor T2 is connected to the data line 171. A second electrode of the second transistor T2 is connected to the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1, and finally, the data voltage DATA is transmitted to the gate electrode of the driving transistor T1 to be stored in the storage capacitor Cst.

The third transistor T3 is an n-type or kind transistor, and has an oxide semiconductor as a semiconductor layer. The third transistor T3 electrically connects the second electrode of the driving transistor T1 and the gate electrode of the driving transistor T1. As a result, it is a transistor that allows the data voltage DATA to be compensated by a threshold voltage of the driving transistor T1 and then stored in the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and the other electrode of the boost capacitor $C_{boost}$ (hereinafter referred to as an 'upper boost electrode'). The third transistor T3 is turned on by a positive voltage of the second scan signal GC transmitted through the second scan line 152 to connect the gate electrode of the driving transistor T1 and the second electrode of the driving transistor T1, and to allow a voltage applied to the gate electrode of the driving transistor T1 to be transmitted to the second storage electrode of the storage capacitor Cst to be stored in the storage capacitor Cst. In this case, the voltage stored in the storage capacitor Cst is stored in a state in which the voltage of the gate electrode of the driving transistor T1 when the driving transistor T1 is turned off is stored and a threshold voltage (Vth) of the driving transistor T1 is compensated.

The fourth transistor T4 is an n-type or kind transistor, and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a positive voltage of the initialization control signal GI received through the initialization control line 153, and at this time, it transmits the first initialization voltage Vinit to the gate electrode of the driving transistor T1, the second storage electrode of the storage capacitor Cst, and the upper boost electrode of the boost capacitor $C_{boost}$ to initialize them.

The fifth transistor T5 and the sixth transistor T6 are p-type or kind transistors, and have silicon semiconductors as a semiconductor layer.

The fifth transistor T5 serves to transmit the driving voltage ELVDD to the driving transistor T1. A gate electrode of the fifth transistor T5 is connected to the light emitting signal line 155, a first electrode of the fifth transistor T5 is connected to the driving voltage line 172, and a second electrode of the fifth transistor T5 is connected to the first electrode of the driving transistor T1.

The sixth transistor T6 serves to transmit a light emitting current outputted from the driving transistor T1 to the light emitting element LED. A gate electrode of the sixth transistor T6 is connected to the light emitting signal line 155, a first electrode of the sixth transistor T6 is connected to the second electrode of the driving transistor T1, and a second electrode of the sixth transistor T6 is connected to the anode of the light emitting element LED.

The seventh transistor T7 is a p-type or kind transistor, and has a silicon semiconductor or oxide semiconductor as a semiconductor layer. The seventh transistor T7 serves to initialize the anode of the light emitting element LED. A gate electrode of the seventh transistor T7 is connected to the first scan line 151, a first electrode of the seventh transistor T7 is connected to the anode of the light emitting element LED, and a second electrode of the seventh transistor T7 is connected to the second initialization voltage line 128. When the seventh transistor T7 is turned on by a negative voltage of the first scan line 151, the second initialization voltage AVinit is applied to the anode of the light emitting element LED to initialize it. In some embodiments, the gate electrode of the seventh transistor T7 may be connected to a separate bypass control line, and may separately control it from the first scan line 151. In some embodiments, the second initialization voltage line 128 to which the second initialization voltage AVinit is applied may be the same as the first initialization voltage line 127 to which the first initialization voltage Vinit is applied.

It is described that one pixel PX includes the seven transistors T1 to T7 and two capacitors (the storage capacitor Cst and the boost capacitor $C_{boost}$), but the present disclosure is not limited thereto, and in some embodiments, the boost capacitor $C_{boost}$ may be removed. In some embodiments, although the third transistor T3 and the fourth transistor T4 are formed as n-type or kind transistors, only one of them may be formed as an n-type or kind transistor or another transistor (for example, the seventh transistor T7) may be formed as an n-type or kind transistor.

In the above, the circuit structure of the pixel positioned in the first display area DA1 (normal display area), the pixel circuit part for the (2-1)-th display area formed in the (2-1)-th display area DA2-1 (intermediate display area), and the light emitting element positioned in the (2-1)-th display area DA2-1 (intermediate display area) has been described with reference to FIG. 12.

Hereinafter, a cross-sectional structure of the pixel positioned in the first display area DA1 (normal display area) having the circuit structure of FIG. 12 and the pixel for the (2-1)-th display area formed in the (2-1)-th display area DA2-1 (intermediate display area) will be described with reference to FIG. 13. In FIG. 13, a structure positioned on an upper portion of the light emitting element (the anode Ar2-1, the intermediate layer (EL layer), and the cathode (Cathode)) is additionally illustrated according to the embodiment. FIG. 13 illustrates a cross-sectional structure of two transistors (LTPS TFT and oxide TFT), wherein the LTPS TFT may be a cross-sectional structure of one of the driving transistor T1, the second transistor T2, the fifth transistor T5, the sixth transistor T6, and the seventh transistor T7, and the oxide TFT may be a cross-sectional structure of one of the third transistor T3 and the fourth transistor T4.

The substrate 110 is a flexible substrate, and may have a structure in which a plurality of insulating layers are formed, and may have a structure in which a layer including (e.g., being) plastic and/or polyimide and an inorganic insulating film are repeatedly formed. In some embodiments, the substrate 110 may be made of a glass material.

The first metal layer BML1 is positioned on the substrate 110, and the first metal layer BML1 is covered by the buffer layer 111. In some embodiments, the first metal layer BML1 may not be positioned in the first display area DA1, but may be positioned only in the (2-1)-th display area DA2-1. The buffer layer 111 may include (e.g., be) an inorganic insulating material such as a silicon nitride (SiNx), a silicon oxide (SiOx), and/or a silicon oxynitride (SiOxNy).

The first semiconductor layer ACT1 formed of a silicon semiconductor (polycrystalline semiconductor) is positioned on the buffer layer 111. The first semiconductor layer ACT1 includes channels of the driving transistor T1, the second transistor T2, the fifth transistor T5, the sixth transistor T6, and the seventh transistor T7, and respective sides of each channel have areas having conductive layer characteristics formed by plasma treatment or doping to serve as first and second electrodes. The first metal layer BML1 may have a structure overlapping a channel of at least one transistor (for example, the driving transistor T1) among the driving transistor T1, the second transistor T2, the fifth transistor T5, the sixth transistor T6, and the seventh transistor T7 in a plan view.

The first gate insulating film 141 may be positioned on the first semiconductor layer. The first gate insulating film 141 may include (e.g., be) an inorganic insulating material such as a silicon nitride (SiNx), a silicon oxide (SiOx), and/or a silicon oxynitride (SiOxNy).

A first gate conductive layer including the gate electrode GAT1 of the driving transistor T1 may be positioned on the first gate insulating film 141. The first gate conductive layer may include the gate electrode of each of the driving transistor T1, the second transistor T2, the fifth transistor T5, the sixth transistor T6, and the seventh transistor T7, and a lower boost electrode of the boost capacitor $C_{boost}$. The channel of each transistor may have a structure overlapping the gate electrode of each transistor in a plan view. The first gate conductive layer may further include the first scan line 151 and the light emitting signal line 155. The first scan line 151 and the light emitting signal line 155 may substantially extend in a horizontal direction (first direction). The first scan line 151 may be connected to the gate electrode of the second transistor T2. The first scan line 151 may be integrated with the gate electrode of the second transistor T2. The first scan line 151 is connected to the gate electrode of the seventh transistor T7, and the gate electrode of the fifth transistor T5 and the gate electrode of the sixth transistor T6 are connected to the light emitting signal line 155.

After the first gate conductive layer including the gate electrode GAT1 of the driving transistor T1 is formed, the exposed area of the first semiconductor layer may be conductive by performing a plasma treatment or a doping process. For example, the first semiconductor layer covered by the first gate conductive layer is not conductive, and a portion of the first semiconductor layer that is not covered by the first gate conductive layer may have the same characteristic as the conductive layer. As a result, the transistor including the conductive portion has a p-type or kind transistor characteristic, so that the driving transistor T1, the second transistor T2, the fifth transistor T5, the sixth transistor T6, and the seventh transistor T7 may be p-type or kind transistors.

The second gate insulating film 142 may be positioned on the first gate conductive layer and the first gate insulating film 141 including the gate electrode GAT1 of the driving transistor T1. The second gate insulating film 142 may include (e.g., be) an inorganic insulating material such as a silicon nitride (SiNx), a silicon oxide (SiOx), and/or a silicon oxynitride (SiOxNy).

A second gate conductive layer including the storage capacitor electrode CstE of the storage capacitor Cst, the second metal layer BML2 of the third transistor T3, and the second metal layer BML2 including a lower shielding layer of the fourth transistor T4 may be positioned on the second gate insulating film 142. The second metal layers BML2 may be positioned under the channels of the third transistor T3 and the fourth transistor T4, respectively, and may serve to shield light and/or electromagnetic interference provided to the channels from lower sides thereof.

The storage capacitor electrode CstE of the storage capacitor Cst overlaps the gate electrode GAT1 of the driving transistor T1 to form the storage capacitor Cst. The second metal layer BML2 of the third transistor T3 may overlap the channel and the gate electrode GAT2 of the third transistor T3, and the lower shielding layer of the fourth transistor T4 may overlap the channel and the gate electrode of the fourth transistor T4.

The first interlayer insulating film 161 may be positioned on the second gate conductive layer. The first interlayer insulating film 161 may include (e.g., be) an inorganic insulating material such as a silicon nitride (SiNx), a silicon oxide (SiOx), and/or a silicon oxynitride (SiOxNy), and in some embodiments, the inorganic insulating material may be thickly formed therein.

The oxide semiconductor layer ACT2 including the channels, the first regions, and the second regions of the third transistor T3, and the fourth transistor T4, may be positioned on the first interlayer insulating film 161. The channel, first region, and second region of the third transistor T3, and the channel, first region, and second region of the fourth transistor T4 may be connected to each other to be integrally formed.

The third gate insulating film 143 is positioned on the oxide semiconductor layer ACT2. The third gate insulating film 143 may include (e.g., be) an inorganic insulating material such as a silicon nitride (SiNx), a silicon oxide (SiOx), and/or a silicon oxynitride (SiOxNy).

A third gate conductive layer including the gate electrode GAT2 of the third transistor T3 and the gate electrode of the fourth transistor T4 may be positioned on the third gate insulating film 143. The gate electrode GAT2 of the third transistor T3 may overlap the channel of the third transistor T3, and may also overlap the second metal layer BML2 of the third transistor T3.

The third gate conductive layer may further include the second scan line 152, the second scan line 152 may extend in a substantially horizontal direction (first direction), and may be connected to the gate electrode GAT2 of the third transistor T3. The gate electrode GAT2 of the third transistor T3 may be electrically connected to the second metal layer BML2 of the third transistor T3 through an opening.

After the third gate conductive layer is formed, through a plasma treatment or doping process, a portion of the oxide semiconductor layer that is covered by the third gate conductive layer is formed as a channel, and a portion of the oxide semiconductor layer that is not covered by the third gate conductive layer is conductive. The channel of the third transistor T3 may overlap the gate electrode GAT2, and a first region and a second region (e.g., a source region and a drain region respectively on two sides of the channel) of the third transistor T3 may not overlap the gate electrode GAT2.

The second interlayer insulating film 162 may be positioned on the third gate conductive layer. The second interlayer insulating film 162 may have a single layered or multi-layered structure. The second interlayer insulating film 162 may include (e.g., be) an inorganic insulating material such as a silicon nitride (SiNx), a silicon oxide (SiOx), and/or a silicon oxynitride (SiOxNy).

The first data conductive layer including one or more suitable connecting electrodes SD1 may be positioned on the second interlayer insulating film 162. The one or more suitable connecting electrodes SD1 may be connected to the first semiconductor layer ACT1 or the second semiconductor layer ACT2, and some of the connecting electrodes may configure the second connecting portion CLr-2 to transmit an output current to the anode Ar2-1.

The first organic film 180 may be positioned on the first data conductive layer. The first organic film 180 may include (e.g., be) one or more selected from polyimide, polyamide, an acryl resin, benzocyclobutene, and a phenol resin.

The second data conductive layer including the data line 171 and the driving voltage line 172 may be positioned on the first organic film 180. The data line 171 and the driving voltage line 172 may substantially extend in the vertical direction (second direction). The data line 171 may be connected to the second transistor T2. The driving voltage line 172 may be connected to the fifth transistor T5. In some embodiments, the driving voltage line 172 may be connected to the storage capacitor electrode CstE.

Referring to FIG. 13, the second data conductive layer may also include the connecting portion CLr. The connecting portion CLr is connected to the second connecting portion CLr-2 through an opening formed in the first organic film 180, and is connected to the sixth transistor T6 to receive an output current.

The second organic film 181 and the third organic film 182 may be positioned on the second data conductive layer including the data line 171, the driving voltage line 172, and the connecting portion CLr. The second organic film 181 and the third organic film 182 may include (e.g., be) one or more organic materials selected from polyimide, polyamide, an acryl resin, benzocyclobutene, and a phenol resin.

The anode Ar2-1 is positioned on the third organic film 182. The anode Ar2-1 is electrically connected to the connecting portion CLr by an opening positioned in the second organic film 181 and the third organic film 182. The anode Ar2-1 may be formed as a single layer including a transparent conductive oxide film and a metal material, or a multilayer including them. The transparent conductive oxide film may include (e.g., be) an indium tin oxide (ITO), a poly-ITO, an indium zinc oxide (IZO), an indium gallium zinc oxide (IGZO), and/or an indium tin zinc oxide (ITZO), and the metal material may include silver (Ag), molybdenum (Mo), copper (Cu), gold (Au), and/or aluminum (Al).

The partition wall 380 covering at least a portion of the anode Ar2-1 while exposing the anode Ar2-1 may be positioned on the anode Ar2-1. The partition wall 380 is referred to as a pixel defining layer PDL, and may be an organic insulating film containing one or more selected from polyimide, polyamide, an acryl resin, benzocyclobutene, and a phenol resin. In some embodiments, the partition wall 380 may be formed as a black pixel defining layer (PDL) having a black color.

Referring to FIG. 13, the spacer 385 is positioned on the partition wall 380. The spacer 385 may be made of the same material as the partition wall 380, or may include (e.g., be) an organic material different from that of the partition wall 380.

The intermediate layer (EL layer) and the cathode (Cathode) may be sequentially formed on the anode Ar2-1, the spacer 385, and the partition wall 380. The intermediate layer (EL layer) and the cathode (Cathode) may be formed on the entire area. The intermediate layer (EL layer) may include a functional layer and a light emitting layer, and the functional layer may be formed on the entire area, but the light emitting layer may be positioned only on the exposed anode Ar2-1 in the opening of the partition wall 380. The functional layer of the intermediate layer (EL layer) may include an auxiliary layer such as an electron injection layer, an electron transport layer, a hole transport layer, and/or a hole injection layer, and the hole injection layer and the hole transport layer may be positioned at a lower portion of the light emitting layer, and the electron transport layer and the electron injection layer may be positioned at an upper portion of the light emitting layer. Referring to FIG. 10, the functional layer of the intermediate layer (EL layer) may also be formed in the (2-2)-th display area DA2-2 and the light transmitting area LTA.

The cathode (Cathode) may be formed of a light transmissive electrode or a reflection electrode. In some embodiments, the cathode (Cathode) may be a transparent or semi-transparent electrode, and may be formed of a metal thin film that includes lithium (Li), calcium (Ca), lithium fluoride/calcium (LiF/Ca), lithium fluoride/aluminum (LiF/Al), aluminum (Al), silver (Ag), magnesium (Mg), and/or a compound thereof and has a small work function. In some embodiments, a transparent conductive oxide (TCO) such as an indium tin oxide (ITO), an indium zinc oxide (IZO), a zinc oxide (ZnO), and/or an indium oxide ($In_2O_3$) may be further disposed on the metal thin film. The cathode (Cathode) may be entirely formed in the first display area DA1 and the (2-1)-th display area DA2-1, but may not be formed in the (2-2)-th display area DA2-2 and the light transmitting area LTA. In some embodiments, the cathode (Cathode) may have a translucent characteristic, and in this case, may form a micro-cavity together with the anode. According to the structure of the micro-cavity, light with a specific wavelength is emitted upward by a gap and characteristic between electrodes at both (e.g., simultaneously) ends thereof, and as a result, red, green, or blue colors may be displayed. In some embodiments, the micro-cavity may be a gap formed between the cathode and the anode.

The encapsulation layer Encap is positioned on the cathode (Cathode). The encapsulation layer Encap includes at least one inorganic layer and at least one organic layer, and in some embodiments, as shown in FIG. 10, it may have a triple-layered structure including the first inorganic encapsulation layer, the organic encapsulation layer, and the second inorganic encapsulation layer. The encapsulation layer Encap may be for protecting the light emitting layer from moisture and/or oxygen that may be introduced from the outside. In some embodiments, the encapsulation layer Encap may have a structure in which an inorganic layer and an organic layer are sequentially further stacked.

In the embodiment of FIG. 13, a sensing insulating layer 510, a plurality of sensing electrodes 540 and 541, and an inorganic passivation film 501 for sensing a touch are positioned on the encapsulation layer Encap. In the embodiment of FIG. 13, a touch may be sensed in a capacitive type or kind by utilizing two sensing electrodes 540 and 541.

For example, the inorganic passivation film 501 is formed on the encapsulation layer Encap, and the plurality of sensing electrodes 540 and 541 are formed thereon. The plurality of sensing electrodes 540 and 541 may be insulated from each other with the sensing insulating layer 510 therebetween, and some thereof may be electrically connected through an opening positioned in the sensing insulating layer 510. In some embodiments, the sensing insulating layer 510 is between the sensing electrodes 540 and 541, and the sensing electrodes 540 and 541 are electrically connected to each other through an opening in the sensing insulating layer 510. Here, the sensing electrodes 540 and 541 may include (e.g., be) a metal such as aluminum (Al), copper (Cu), silver (Ag), gold (Au), molybdenum (Mo), titanium (Ti), or tantalum (Ta), or a metal alloy thereof, and may be formed as a single layer or a multilayer.

The sensing electrodes 540 and 541 may be formed in the first display area DA1 and the (2-1)-th display area DA2-1, but may not be formed in the (2-2)-th display area DA2-2. In some embodiments, the inorganic passivation film 501 and the sensing insulating layer 510 may be formed not only in the first display area DA1 and the (2-1)-th display area DA2-1, but also in the (2-2)-th display area DA2-2. In this case, both (e.g., simultaneously) the inorganic passivation film 501 and the sensing insulating layer 510 may be an inorganic insulating film.

A light blocking member 220 and a color filter layer 230 are positioned on the upper sensing electrode 541. The light blocking member 220 and the color filter layer 230 may be formed in the first display area DA1 and the (2-1)-th display area DA2-1, but are not formed in the (2-2)-th display area DA2-2.

The light blocking member 220 may be positioned to overlap the sensing electrodes 540 and 541 in a plan view, and may be positioned so as to not overlap the anode Ar2-1 in a plan view. This is to prevent the anode Ar2-1 capable of displaying an image from being covered by the light blocking member 220 and the sensing electrodes 540 and 541, or to reduce the amount of the anode Ar2-1 that is covered by the light blocking member 220 and the sensing electrodes 540 and 541.

The color filter layer 230 may be positioned on the sensing insulating layer 510 and the light blocking member 220. The color filter layer 230 includes a red color filter that transmits red light, a green color filter that transmits green light, and a blue color filter that transmits blue light. Each color filter layer 230 may be positioned so as to overlap the anode Ar2-1 of the light emitting element (e.g., the anode of a corresponding light emitting element) in a plan view. Light emitted from the intermediate layer (EL layer) may be changed to a corresponding color to be emitted while passing through a color filter.

The light blocking member 220 may be positioned between respective color filters 230. In some embodiments, the color filter layer 230 may be replaced with a color conversion layer, or may further include a color conversion layer. The color conversion layer may include a quantum dot.

A planarization layer covering the color filter layer 230 may be positioned on the color filter layer 230, and a planarizing plate may be additionally coupled (e.g., attached) thereon.

In the above, the cross-sectional structure of the pixel circuit part in the first display area DA1 (normal display area) and the pixel circuit part for the (2-1)-th display area formed in the (2-1)-th display area DA2-1 (intermediate display area) has been described with reference to the structure of FIG. 13.

In the embodiment shown in FIG. 10, the additional inorganic insulating films (the first additional inorganic insulating film 185, the second additional inorganic insulating film 186, and the third additional inorganic insulating film 187) may be formed in the pixel circuit part of the first display area DA1 (normal display area) and the pixel circuit part for the (2-1)-th display area of the (2-1)-th display area DA2-1 (intermediate display area).

Hereinafter, a structure of the pixel circuit part positioned in the first display area DA1 (normal display area) and of the pixel positioned in the (2-1)-th display area DA2-1 (intermediate display area) will be described through embodiments of FIG. 14 and FIG. 15, and all transistors positioned in the pixel may utilize only the same semiconductor layer.

Figure 14:
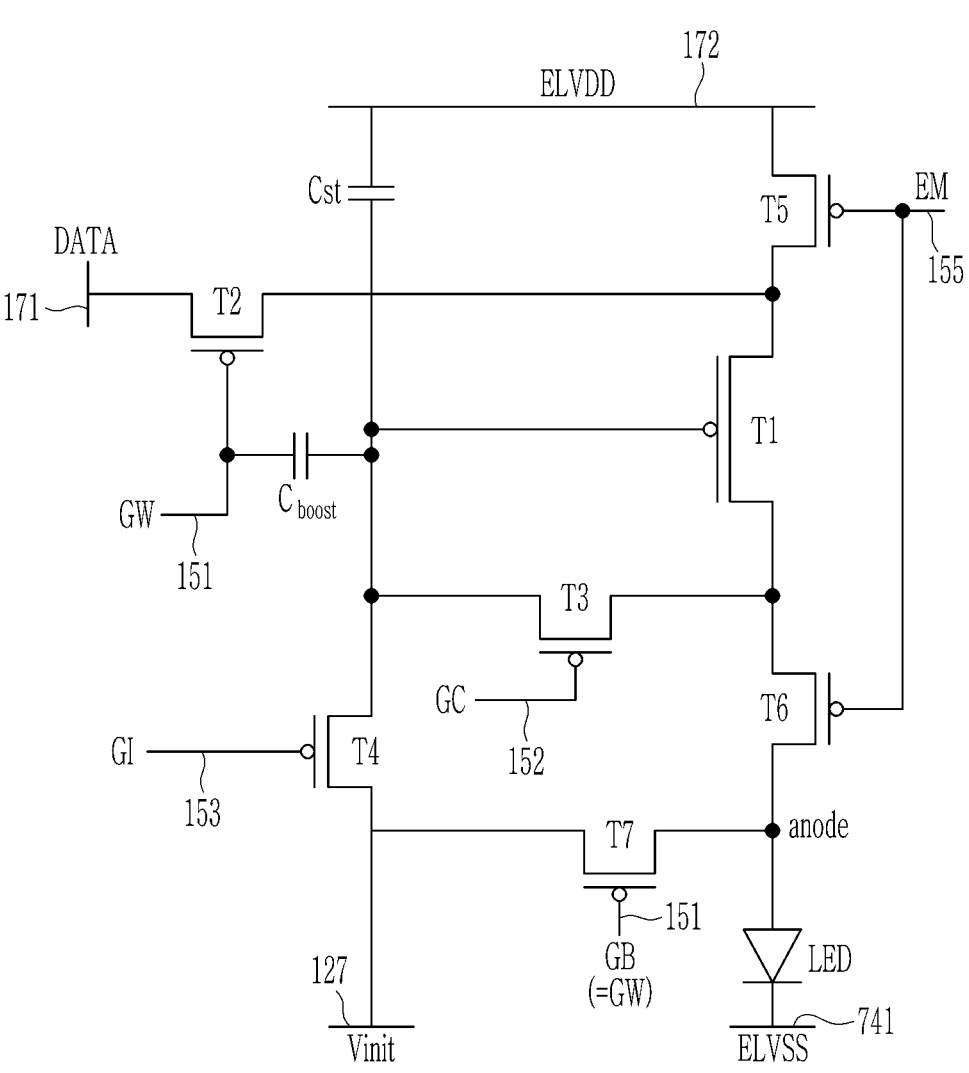
FIG. 14 illustrates a circuit diagram of one pixel included in a light emitting display device according to another embodiment.
Figure 15:
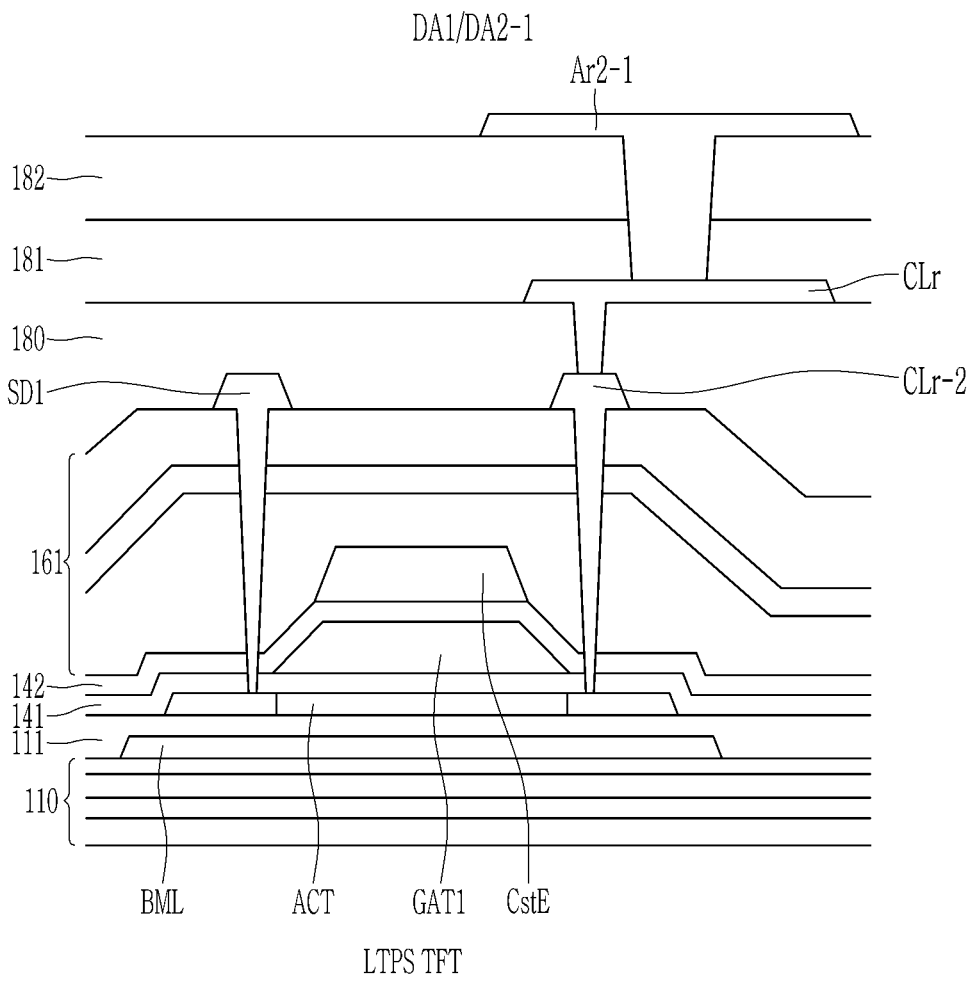
FIG. 15 illustrates a cross-sectional view of the pixel according to the embodiment of FIG. 14.

FIG. 14 illustrates a circuit diagram of one pixel included in a light emitting display device according to another embodiment, and FIG. 15 illustrates a cross-sectional view of the pixel according to the embodiment of FIG. 14.

Unlike FIG. 12, FIG. 14 illustrates an embodiment in which the third transistor T3 and the fourth transistor T4 are formed as transistors including (e.g., being) a polycrystalline semiconductor, and thus all thin film transistors are formed of only polycrystalline semiconductors.

Referring to FIG. 14, one pixel PX includes a pixel circuit part including a plurality of transistors and capacitors, and a light emitting device LED that receives a current from the pixel circuit part to emit light.

As shown in FIG. 14, one pixel PX of the display device according to the embodiment includes transistors T1, T2, T3, T4, T5, T6, and T7, a storage capacitor Cst, a boost capacitor $C_{boost}$, and the light emitting element LED, connected to a plurality of wires 127, 151, 152, 153, 154, 155, 171, 172, and 741.

The plurality of wires 127, 151, 152, 153, 155, 171, 172, and 741 are connected to one pixel PX. The plurality of wires includes a first initialization voltage line 127, a first scan line 151, a second scan line 152, an initialization control line 153, a light emitting signal line 155, a data line 171, a driving voltage line 172, and a common voltage line 741.

The second scan line 152 and the initialization control line 153, which are different from those of FIG. 12, will be described as follows.

The second scan line 152 may be the same wire as the first scan line 151, and transmits the second scan signal GC, which is the same scan signal as the first scan signal GW, to the third transistor T3. The initialization control line 153 transmits the initialization control signal GI to the fourth transistor T4.

The plurality of transistors included in the pixel circuit part may include a driving transistor T1, a second transistor T2, a third transistor T3, a fourth transistor T4, a fifth transistor T5, a sixth transistor T6, and a seventh transistor T7. The plurality of transistors may include a polycrystalline silicon semiconductor.

The third transistor T3 and fourth transistor T4 that are different from those of FIG. 12 will be described as follows.

The third transistor T3 is a p-type or kind transistor, and has a polycrystalline semiconductor as a semiconductor layer. The third transistor T3 electrically connects the second electrode of the driving transistor T1 and the gate electrode of the driving transistor T1. As a result, it is a transistor that allows the data voltage DATA to be compensated by a threshold voltage of the driving transistor T1 and then stored in the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and the other electrode of the boost capacitor $C_{boost}$ (hereinafter referred to as an 'upper boost electrode'). The third transistor T3 is turned on by a negative voltage of the second scan signal GC transmitted through the second scan line 152 to connect the gate electrode of the driving transistor T1 and the second electrode of the driving transistor T1, and to allow a voltage applied to the gate electrode of the driving transistor T1 to be transmitted to the second storage electrode of the storage capacitor Cst to be stored in the storage capacitor Cst. In this case, the voltage stored in the storage capacitor Cst is stored in a state in which the voltage of the gate electrode of the driving transistor T1 when the driving transistor T1 is turned off is stored and a threshold voltage (Vth) of the driving transistor T1 is compensated.

The fourth transistor T4 is a p-type or kind transistor, and has a polycrystalline semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a negative voltage of the initialization control signal GI received through the initialization control line 153, and at this time, it transmits the first initialization voltage Vinit to the gate electrode of the driving transistor T1, the second storage electrode of the storage capacitor Cst, and the upper boost electrode of the boost capacitor $C_{boost}$ to initialize them.

Hereinafter, a cross-sectional structure of the first display area DA1 and the (2-1)-th display area DA2-1 will be described with reference to FIG. 15.

The substrate 110 is a flexible substrate, and may have a structure in which a plurality of insulating layers are formed, and may have a structure in which a layer including (e.g., being) plastic and/or polyimide and an inorganic insulating film are repeatedly formed. In some embodiments, the substrate 110 may be made of a glass material. Therefore, the substrate 110 may have one or more suitable degrees of flexibility. The substrate 110 may be a rigid substrate, or a flexible substrate that is bendable, foldable, and/or rollable.

The metal layer BML is positioned on the substrate 110, and the metal layer BML is covered by the buffer layer 111. In some embodiments, the metal layer BML may not be positioned in the first display area DA1, but may be positioned only in the (2-1)-th display area DA2-1. The buffer layer 111 may block or reduce impurities from being transmitted from the substrate 110 to an upper layer of the buffer layer 111 (e.g., a layer on an upper surface of the buffer layer 111), particularly the semiconductor layer ACT, thereby preventing or reducing characteristic degradation of the semiconductor layer ACT and reducing stress. The buffer layer 111 may include (e.g., be) an inorganic insulating material such as a silicon nitride (SiNx), a silicon oxide (SiOx), and/or a silicon oxynitride (SiOxNy).

The semiconductor layer ACT is positioned on the buffer layer 111. The semiconductor layer ACT may include (e.g., be) polycrystalline silicon, and the semiconductor layer ACT includes a channel region overlapping the gate electrode GAT1, and a first region and a second region (e.g., a source region and a drain region) positioned at respective sides thereof. Impurities are doped in the first and second regions of the semiconductor layer ACT except for the channel region thereof, so that they may have the same or a similar conductive characteristic as a conductor.

The first gate insulating film 141 is positioned on the semiconductor layer ACT. The first gate insulating film 141 may include (e.g., be) an inorganic insulating material such as a silicon nitride (SiNx), a silicon oxide (SiOx), and/or a silicon oxynitride (SiOxNy), and may have a single-layered or multi-layered structure.

The first gate conductive layer including the gate electrode GAT1 is positioned on the first gate insulating film 141. The gate electrode GAT1 may overlap the channel region of the semiconductor layer ACT in a plan view.

The second gate insulating film 142 is positioned on the first gate conductive layer. The second gate insulating film 142 may include (e.g., be) an inorganic insulating material such as a silicon nitride (SiNx), a silicon oxide (SiOx), and/or a silicon oxynitride (SiOxNy), and may have a single-layered or multi-layered structure.

The second gate conductive layer including the storage capacitor electrode CstE is positioned on the second gate insulating film 142. The storage capacitor electrode CstE overlaps the gate electrode GAT1 to configure the storage capacitor Cst.

The first interlayer insulating film 161 is positioned on the second gate conductive layer. The first interlayer insulating film 161 may include (e.g., be) an inorganic insulating material such as a silicon nitride (SiNx), a silicon oxide (SiOx), and/or a silicon oxynitride (SiOxNy), and may have a single-layered or multi-layered structure, and in FIG. 15, a structure in which it is configured of a plurality of layers is illustrated.

The first data conductive layer including the connecting member SD1 connected to the semiconductor layer ACT is positioned on the first interlayer insulating film 161. The connecting member SD1 may be electrically connected to the first region and the second region of the semiconductor layer ACT through an opening formed in the first interlayer insulating film 161, the second gate insulating film 142, and the first gate insulating film 141. One of the connecting members SD1 may configure (e.g., at least partially or entirely provide or constitute) the second connecting portion CLr-2, so that an output current may be transmitted to the anode Ar2-1.

The first organic film 180 is positioned on the first data conductive layer, and the first organic film 180 may include (e.g., be) one or more organic materials selected from polyimide, polyamide, an acryl resin, benzocyclobutene, and a phenol resin.

The second data conductive layer including the connecting portion CLr is positioned on the first organic film 180. The connecting portion CLr serves to connect the second connecting portion CLr-2 and the anode Ar2-1.

The second organic film 181 and the third organic film 182 are sequentially positioned on the second data conductive layer, and the second organic film 181 and the third organic film 182 may include (e.g., be) one or more organic materials selected from polyimide, polyamide, an acryl resin, benzocyclobutene, and a phenol resin.

The anode Ar2-1 is positioned on the third organic film 182, and the anode Ar2-1 configures one electrode of the light emitting element. A structure of an upper portion of the anode Ar2-1 may have a stacked structure identical or similar to that of FIG. 13.

Although only one transistor is illustrated in FIG. 15, each pixel may include the plurality of transistors as shown in FIG. 14.

In the embodiment shown in FIG. 10, the additional inorganic insulating films (the first additional inorganic insulating film 185, the second additional inorganic insulating film 186, and the third additional inorganic insulating film 187) may be formed in the pixel circuit part of the first display area DA1 (normal display area) and the pixel circuit part for the (2-1)-th display area of the (2-1)-th display area DA2-1 (intermediate display area).

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this disclosure has been described in connection with what is presently considered to be practical embodiments, it is to be understood that the present disclosure is not limited to the disclosed embodiments, but, on the contrary, is intended to cover one or more suitable modifications and equivalent arrangements included within the spirit and scope of the appended claims and equivalents thereof.

DESCRIPTION OF SYMBOLS

DP: display panel
DA1: first display area
DA2: second display area
DA2-1: (2-1)-th display area
DA2-2: (2-2)-th display area
LTA: light transmitting area
OS: optical element
LED: Light emitting element
EDr1, EDg1, EDb1: light emitting element for first display area
EDr2-1, EDg2-1, EDb2-1: light emitting element for (2-1)-th display area
EDr2-2, EDg2-2, EDb2-2: light emitting element for (2-2)-th display area
PCr1, PCg1, PCb1: pixel circuit part for first display area
PCr2-1, PCg2-1, PCb2-1: pixel circuit part for (2-1)-th display area
PCr2-2, PCg2-2, PCb2-2: pixel circuit part for (2-2)-th display area
CLr, CLg, CLb, CLr-2, CLr-3, CLr-4: connecting portion
TCLr, TCLg, TCLb: transparent connecting wire
TCLrc, TCLgc, TCLbc, TCLrc-2: copy connecting wire
Ar2-1, Ag2-1, Ab2-1: anode for (2-1)-th display area
Ar2-2, Ag2-2, Ab2-2: anode for (2-2)-th display area
Ar2-2c, Ag2-2c, Ab2-2c: copy anode
110: substrate 111: buffer layer
141: first gate insulating film
142: second gate insulating film
143: third gate insulating film
161: first interlayer insulating film
162: second interlayer insulating film
180: first organic film
181: second organic film
182: third organic film
185, 186, 187: additional inorganic insulating film
BML, BML1, BML2: metal layer ACT1, ACT2: semiconductor layer GAT1, GAT2: gate electrode CstE: storage capacitor electrode EL layer: intermediate layer 380: partition wall OP: opening 385: spacer 501: inorganic passivation layer 510: sensing insulating layer 540, 541: sensing electrode Encap: encapsulation layer Encap1: first encapsulation inorganic layer Encap2: encapsulation organic layer Encap3: second encapsulation inorganic layer

What is claimed is:

1. A light emitting display device, comprising:
a first display area that comprises a first pixel circuit part and a first light emitting element connected to the first pixel circuit part;
a (2-1)-th display area that comprises a (2-1)-th pixel circuit part, a (2-1)-th light emitting element connected to the (2-1)-th pixel circuit part, and a (2-2)-th pixel circuit part; and
a (2-2)-th display area that comprises a (2-2)-th light emitting element connected to the (2-2)-th pixel circuit part and a light transmitting area,
wherein the first pixel circuit part of the first display area is below the first light emitting element,
the (2-1)-th pixel circuit part of the (2-1)-th display area is below the (2-1)-th light emitting element, and
at least one organic film in the first pixel circuit part and in the (2-1)-th pixel circuit part is not included in the light transmitting area.

2. The light emitting display device of claim 1, further comprising a transparent connecting wire that connects the (2-2)-th pixel circuit part and a pixel electrode of the (2-2)-th light emitting element, and is made of a transparent conductive material.

3. The light emitting display device of claim 2, wherein the transparent connecting wire is positioned across the (2-1)-th display area and the (2-2)-th display area.

4. The light emitting display device of claim 3, further comprising a connecting portion connecting the (2-1)-th pixel circuit part and a (2-1)-th pixel electrode of the (2-1)-th light emitting element,
wherein the connecting portion is in the (2-1)-th display area.

5. The light emitting display device of claim 2, further comprising:
a first additional inorganic insulating film between the transparent connecting wire and a substrate; and
a second additional inorganic insulating film between the transparent connecting wire and the pixel electrode of the (2-2)-th light emitting element.

6. The light emitting display device of claim 5, wherein the first additional inorganic insulating film and the second additional inorganic insulating film comprise at least one inorganic insulating material selected from a silicon nitride (SiNx), a silicon oxide (SiOx), and a silicon oxynitride (SiOxNy).

7. The light emitting display device of claim 5, further comprising an encapsulation layer positioned across the first display area, the (2-1)-th display area and the (2-2)-th display area, wherein the encapsulation layer comprises a first encapsulation inorganic layer, an encapsulation organic layer, and a second encapsulation inorganic layer that are sequentially stacked.

8. The light emitting display device of claim 7, wherein:

a functional layer is between a pixel electrode and an opposite electrode in each of the first light emitting element, the (2-1)-th light emitting element, and the (2-2)-th light emitting element;

the functional layer is positioned across the first display area, the (2-1)-th display area, and the (2-2)-th display area; and in the light transmitting area, the second additional inorganic insulating film, the functional layer, and the first encapsulation inorganic layer are sequentially stacked.

9. The light emitting display device of claim 5, further comprising:

a copy connecting wire between the substrate and the first additional inorganic insulating film;

a second copy connecting wire on the first additional inorganic insulating film; and a copy pixel electrode on the second additional inorganic insulating film, wherein the (2-2)-th pixel circuit part and the copy pixel electrode are electrically connected by the copy connecting wire and the second copy connecting wire, and the copy connecting wire and the second copy connecting wire are made of a transparent conductive material.

10. The light emitting display device of claim 5, further comprising:

a buffer layer between a substrate and the first additional inorganic insulating film;

a copy connecting wire between the substrate and the buffer layer;

a second copy connecting wire on the buffer layer; and a copy pixel electrode on the second additional inorganic insulating film, wherein the (2-2)-th pixel circuit part and the copy pixel electrode are electrically connected by the copy connecting wire and the second copy connecting wire, and the copy connecting wire and the second copy connecting wire are made of a transparent conductive material.

11. The light emitting display device of claim 5, wherein the first additional inorganic insulating film and the second additional inorganic insulating film extend into at least one selected from the first display area and the (2-1)-th display area.

12. The light emitting display device of claim 5, further comprising a third additional inorganic insulating film on the second additional inorganic insulating film.

13. The light emitting display device of claim 1, wherein:

the first light emitting element of the first display area at least partially overlaps the first pixel circuit part connected to the first light emitting element in a plan view; and the (2-1)-th light emitting element of the (2-1)-th display area does not overlap the (2-1)-th pixel circuit part connected to the (2-1)-th light emitting element in the plan view.

* * * * *